(12) United States Patent
Sekiguchi et al.

(10) Patent No.: US 6,207,728 B1
(45) Date of Patent: Mar. 27, 2001

(54) PHOTO-CURABLE COMPOSITION AND PHOTO-CURED PRODUCT

(75) Inventors: Manabu Sekiguchi; Naoki Sugiyama; Hozumi Sato, all of Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/335,269

(22) Filed: Jun. 17, 1999

(30) Foreign Application Priority Data

| Jun. 18, 1998 | (JP) | 10-170885 |
| Jul. 9, 1998 | (JP) | 10-194817 |
| Aug. 4, 1998 | (JP) | 10-220512 |
| Aug. 4, 1998 | (JP) | 10-220513 |
| Aug. 4, 1998 | (JP) | 10-220514 |

(51) Int. Cl.$^7$ .............................. C08K 3/22; C08K 3/36; C08L 83/02; C08L 83/04; C08J 3/28
(52) U.S. Cl. ........................ 522/83; 522/84; 522/85; 522/86; 522/31; 522/59; 522/99; 522/113; 522/148; 522/172
(58) Field of Search ................. 522/83–86, 31, 522/59, 99, 148, 172, 113

(56) References Cited

U.S. PATENT DOCUMENTS

| 4,101,513 | * | 7/1978 | Fox et al. . |
| 4,451,602 | * | 5/1984 | Furakawa et al. . |
| 4,486,504 | * | 12/1984 | Chung . |
| 5,063,114 | * | 11/1991 | Nambu et al. . |
| 5,306,759 | * | 4/1994 | Sakagami et al. . |
| 5,385,955 | * | 1/1995 | Tarshiani et al. . |
| 5,457,003 | * | 10/1995 | Tanaka et al. . |
| 5,504,235 | * | 4/1996 | Hirose et al. . |
| 5,891,958 | * | 4/1999 | Nambu et al. . |

FOREIGN PATENT DOCUMENTS

| 0 345 575 | 12/1989 | (EP) . |
| 0 427 293 | 5/1991 | (EP) . |
| 0 466 025 | 1/1992 | (EP) . |

\* cited by examiner

Primary Examiner—Susan W. Berman
(74) Attorney, Agent, or Firm—Oblon, Spivak, McClelland, Maier & Neustadt, P.C.

(57) ABSTRACT

Disclosed is a photo-curable composition comprising the following components (A) to (C): (A) hydrolyzable silane compound represented by the general formula (1) or a hydrolyzate thereof: $(R^1)_p Si(X)_{4-p}$ (1) wherein $R^1$ is a non-hydrolyzable organic group having 1 to 12 carbon atoms, X is a hydrolyzable group, and p is an integer of 0 to 3; (B) photo acid generator; and (C) dehydrating agent. By such constitution, it is possible to provide a photo-curable composition which has a rapid photo-curable rate, is excellent in characteristics such as storage stability, heat resistance, weather-ability, scratch resistance and the like, and is applicable to base materials having low heat resistance such as plastics, as well as a cured product obtained therefrom.

12 Claims, 1 Drawing Sheet

PHOTO-CURABLE COMPOSITION AND PHOTO-CURED PRODUCT

BACKGROUND OF THE INVENTION

1. Field of the Invention

The present invention relates to a photo-curable composition and a photo-cured product thereof (hereinafter, also called cured product or cured film). Specifically, the present invention relates to a photo-curable composition which is excellent in storage stability and applicable to the surfaces of plastics, metals, ceramics, glass, wood, papers and the like having various shapes and which can give a photo-cured product excellent in weather-ability, heat resistance, transparency and scratch resistance, as well as a photo-cured product thereof.

Accordingly, the photo-curable composition and photo-cured product of the present invention are suitable for use in paints for metals, sizing agents for use in slate materials, hard coatings for plastic films, hard coatings for printing paper, stain-proof films for floor and wall tiles, hard coatings for optical lens, protective films for display elements, anti-reflective films, highly reflective films, selectively permeable films, fibrous coating reinforcing materials, resins for optical three-dimensional molding, optical lens, packaging compounds for semiconductors, insulating layers for semiconductors, adhesives for semiconductors, adhesives for optical products, printing plate materials, optical light-guide materials and optical switching materials.

2. Prior Art

As materials for forming the transparent cured film, thermosetting polysiloxane compositions are known and disclosed in Japanese Patent Application Laid-Open No. Sho 53-12952 and the like.

However, the cured films obtained from such thermosetting polysiloxane compositions, though being superior in weather-ability and scratch resistance, should be thermally treated at high temperatures for a long time, so there are problems that the productivity is low and the type of usable substrate is limited. Further, such thermosetting polysiloxane compositions have a problem that their performance becomes inferior during storage at normal temperatures, so they should be stored in a low-temperature state under the strict control of temperature.

On the other hand, as materials for forming the transparent cured film, photo-curable acrylic compositions which can be cured by using such rays as a UV light, are also known. Such photo-curable acrylic compositions are utilized in the field of hard coating and the like in various plastics because their curing rate is high and they can be cured at normal temperatures.

However, since the major components in the photo-curable compositions are an acrylic resin, there is a problem of low heat resistance and weather-ability as compared with the above-described thermosetting polysiloxane. In addition, since radical polymerization is utilized for the photo-curable acrylic compositions, there is a problem that inactivation of active radicals by oxygen in the atmosphere easily occurs so insufficient curing readily results. In particular, such insufficient curing easily occurs upon exposure to UV rays under the atmosphere.

Accordingly, photo-curable compositions having polymerizable groups such as a vinyl group, an epoxy group and the like introduced into silane compounds have been proposed for the purpose of improving weather-ability and scratch resistance. For example, U.S. Pat. No. 5,385,955 discloses a photo-curable composition comprising alkoxy silane having an epoxy group, a hydrolyzate of alkyl alkoxy silane, colloidal silica, and a photo-initiator.

However, there is a problem that such photo-curable compositions are sensitive to moisture while their photo-curing time (photo-curable property) is long. Accordingly, the insufficient curing easily occurs and there is a problem of unstableness in the characteristics of the resulting photo-cured products, such as heat resistance and weather-ability. On the other hand, if their photo-curable rate is raised, there is a problem that the storage stability of the photo-curable composition easily becomes poor.

Accordingly, Japanese Patent Application Laid-Open No. Hei 6-148895 discloses a photo-sensitive resin composition comprising: an alkali-soluble siloxane polymer obtained by hydrolysis in the presence of water and a catalyst and subsequent removal of the water and the catalyst by use of a hydrophobic organic solvent and a drying agent; a photo acid generator; and a solvent, and the hydroxyl group itself possessed by the siloxane polymer is utilized for photo-curable reaction.

However, when the hydrophobic organic solvent is merely used, water cannot be removed sufficiently from the photo-sensitive resin composition, and further the photo-sensitive resin composition does not contain a hydrating agent, so it is not possible to eliminate the influence of water or moisture from the outside or of water generated with time from the siloxane polymer.

OBJECT OF THE INVENTION

As described the above, the curing time of the conventional thermosetting polysiloxane compositions is long, and high-temperature heat treatment is required, so there are problems that applicable base materials are limited and storage stability is poor. On the other hand, the conventional photo-curable compositions comprising an acrylic type resin or a silicone type resin having polymerizable groups such as a vinyl group and an epoxy group respectively have the problems that they are poor in photo-curable property, and the resulting cured products are poor in weather-ability and heat resistance. Further, even the photo-sensitive resin composition disclosed in Japanese Patent Application Laid-Open No. Hei 6-148895 has a problem that it is poor in the photo-curable property and the storage stability, and the resulting photo-cured product is poor in the weather-ability and the heat resistance.

As a result of their eager study under these circumstances, the present inventors have found that the above problems can be solved by combination of a hydrolyzable silane compound, a photo acid generator, and a dehydrating agent. That is, the present inventors have found that by adding a dehydrating agent to a photo-curable composition, water contained in the photo-curable composition, water formed by self-condensation of the hydrolyzable silane compound, and water from the atmosphere at the time of coating are effectively removed whereby the photo-curable reaction of the photo-curable composition is significantly accelerated, and further the characteristics of the photo-curable composition can be maintained stably for a prolonged period of time.

Thus, the object of the present invention is to provide a photo-curable composition which has rapid photo-curable rate, and excellent in characteristics such as storage stability, heat resistance, weather-ability, scratch resistance and the like, and which is applicable to base materials with low heat resistance such as plastics, as well as a cured product including cured film obtained therefrom.

Another object of the present invention is to provide a photo-curing method for producing the a photo-cured product thereof.

SUMMARY OF THE INVENTION

The present invention relates to a photo-curable composition comprising the following components (A) to (C):

(A) both a hydrolyzable silane compound represented by the general formula (1) and a hydrolyzate or either of the two, $$(R^1)_p Si(X)_{4-p} \tag{1}$$

wherein $R^1$ is a non-hydrolyzable organic group having 1 to 12 carbon atoms, X is a hydrolyzable group, and p is an integer of 0 to 3;

(B) photo acid generator; and (C) dehydrating agent.

The photo-curable composition was constituted in this manner whereby the photo-curable reaction can be promoted and simultaneously storage stability and the like can be significantly improved. Further, such photo-curable composition can be subjected to pattern irradiation at normal temperatures without undergoing oxygen inhibition.

To constitute the photo-curable composition of the present invention, a hydrolyzable silane compound other than component (A) is preferably added, and specifically it is preferable to add the following components: a hydrolyzable silane compound represented by the following general formula (2) or a hydrolyzate thereof as component (D); vinyl polymer having a hydrolyzable silyl group represented by the following general formula (3) as component (F); and a hydrolyzable titanium compound represented by the following general formula (4) or a hydrolyzate thereof as component (G).

$$(Y)(R^1)_q Si(X)_{3-q} \tag{2}$$

wherein $R^1$ and X have the same meanings as defined in the general formula (1), Y is an isocyanate group, a mercapto group, an epoxy group, an oxetane group or an acryloyl group, and q is an integer of 0 to 2.

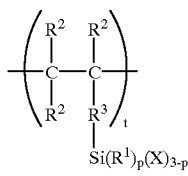

(3)

wherein $R^2$ groups are independently a hydrogen atom, a halogen atom or a monovalent organic group having 1 to 12 carbon atoms, $R^3$ is a single bond or a divalent organic group having 1 to 200 carbon atoms, t is an integer of 1 to 1000, and $R^1$, X and p have the same meanings as defined in the general formula (1). Both of the terminals of the formula (3) are hydrogen atoms or a residue of radical polymerization initiators and the like.

$$Ti(X)_4 \tag{4}$$

wherein X has the same meanings as defined in the general formula (1).

To constitute the photo-curable composition of the present invention, it is preferable to add a fluorine-containing polymer as component (E) and metal oxide particles as component (H).

To constitute the photo-curable composition of the present invention, it is preferable that the dehydrating agent is at least one compound selected from the group consisting of carboxylates (hereinafter referring to carboxylic acid esters), acetals and carboxylic anhydrides; the amount of the dehydrating agent added is in the range of 0. 1 to 100 parts by weight relative to 100 parts by weight of component (A); and the boiling point of the dehydrating agent is preferably in the range of 40 to 200° C. under the condition of normal pressures.

Further, another embodiment of the present invention is a photo-cured product having the above-described photo-curing composition cured by radiation and photo-curing method. Accordingly, the photo-curable composition which is excellent in the photo-curable property and the storage stability Is used to give stable characteristics, resulting in improvements in the weather-ability, the heat resistance and the like of the photo-cured product.

The present invention also relates to a photo-cured product or a photo-curing method for the above-mentioned photo-curable composition by radiation.

BEST MODES FOR CARRYING OUT THE INVENTION

Figure 1:
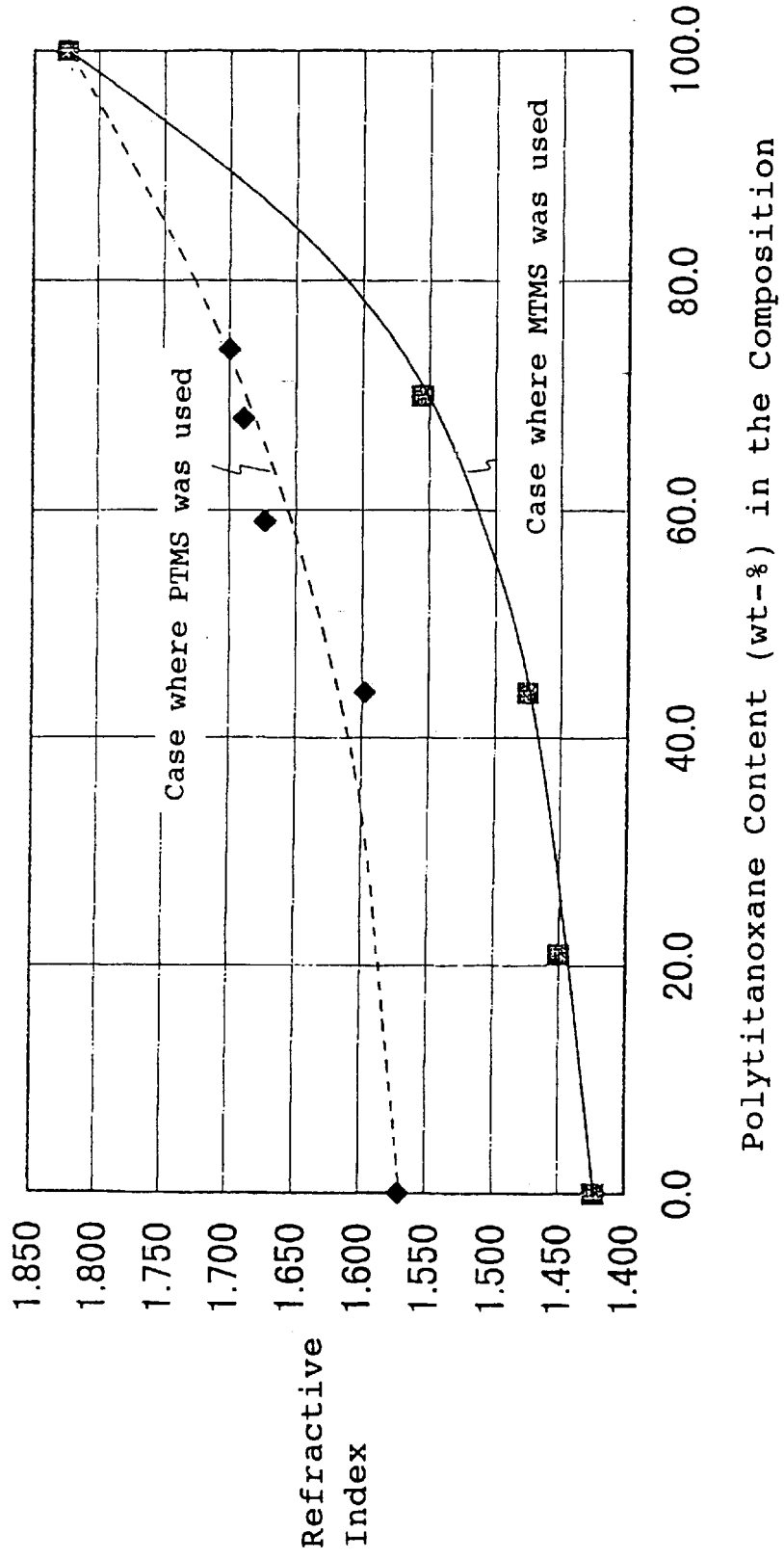
FIG. 1 is a drawing showing the relationship between the polytitanoxane content in the photo-curable composition and the refractive index of the photo-cured product.

The modes for carrying out the photo-curable composition and the photo-cured product are described specifically from the viewpoint of the constituent components and the states of the photo-curable composition.

FIRST EMBODIMENT

The first embodiment of the present invention is a photo-curable composition comprising a hydrolyzate of a hydrolyzable silane compound(component A), a photo acid generator (component B) and a dehydrating agent (component C). Accordingly, by irradiating the photo acid generator with UV rays, an acid (acidic active species) is generated, and this acid can be utilized to photocure the component (A) effectively.

(1) Hydrolyzate of Hydrolyzable Silane Compound
① Structure

The hydrolyzate used in the first embodiment is a compound obtained by hydrolysis of a hydrolyzable silane compound represented by the general formula (1):

$$(R^1)_p Si(X)_{4-p} \tag{1}$$

wherein $R^1$ is a non-hydrolyzable organic group having 1 to 12 carbon atoms, X is a hydrolyzable group, and p is an integer of 0 to 3.

In this hydrolyzate, partially non-hydrolyzed hydrolyzable group X may remain, and the hydrolyzate in this case is a mixture of the hydrolyzable silane compound and a hydrolyzate thereof. As used herein, the term "hydrolyzate" refers not only to the compound which an alkoxy group is converted by hydrolysis into a silanol group but also to a partially condensed product thereof condensed via some silanol groups. Further, the hydrolyzable silane compound represented by the general formula (1) is not necessarily required to be in the form of a hydrolyzate thereof at the time of the photo-curable composition formulated, and at least a part of hydrolyzable groups X may be in the form of a hydrolyzate at the stage of irradiation. That is, in the photo-curable composition of the first embodiment, if the hydrolyzable silane compound is used without previously subjecting it to hydrolysis, water is added previously to hydrolyze the hydrolyzable group to form a silanol group whereby the photo-curable composition can be optically cured.

② Hydrolyzable Group X

The hydrolyzable group X in the general formula (1) refers to a group capable of being hydrolyzed to form a silanol group upon heating in the temperature range of room temperature (25° C.) to 100° C. in the absence of a catalyst and in the excessive presence of water, or to a group capable of forming a siloxane condensate. Specifically, group X includes a hydrogen atom, a $C_1$ to $C_{12}$ alkoxy group, a halogen atom, an amino group, a carboxyl group and the like.

The appendix "p" assigned to the hydrolyzable group X in the general formula (1) is preferably an integer of 0 to 3, more preferably an integer of 0 to 2, and most preferably 1.

Further, the organic group $R^1$ in the general formula (1) is a non-hydrolyzable group which is stable under the conditions where the hydrolyzable group X is hydrolyzed, and this organic group may be selected from polymerizable or non-polymerizable organic groups.

The non-polymerizable organic group $R^1$ includes an alkyl group, an aryl group, an aralkyl group and the like. Specifically, the mention can be made of a methyl group, an ethyl group, a propyl group, a butyl group, a hexyl group, a cyclohexyl group, an octyl group, a deuterated alkyl group, a halogenated alkyl group, a phenyl group, a tolyl group, a xylyl group, a naphthyl group, a biphenyl group, a deuterated aryl group, a halogenated aryl group, a benzyl group, a phenylethyl group and the like.

The polymerizable group $R^1$ includes a radical-polymerizable functional group and a cationic-polymerizable functional group. Thus, group $R^1$ enables not only curing reaction of silanol groups but also curing reaction of cationic-polymerizable functional groups in the presence of a photo acid generator.

③ Examples

Examples of hydrolyzable silane compounds (also called silane compounds) represented by the general formula (1) are described. That is, the silane compounds having the non-polymerizable organic group $R^1$ include silane compounds substituted with four hydrolyzable groups, such as tetrachlorosilane, tetraaminosilane, tetraacetoxysilane, tetramethoxysilane, tetraethoxysilane, tetrabutoxysilane, tetraphenoxysilane, tetrabenzyloxysilane, trimethoxysilane, and triethoxysilane.

Similarly, the mention may be made of silane compounds substituted with three hydrolyzable groups, such as methyltrichlorosilane, methyltrimethoxysilane, methyltriethoxysilane, methyltributoxysilane, ethyltrimethoxysilane, ethyltriisopropoxysilane, ethyltributoxysilane, butyltrimethoxysilane, pentafluorophenyltrimethoxysilane, phenyltrimethoxysilane, $d_3$-methyltrimethoxysilane, nonafluorobutylethyltrimethoxysilane, and trifluoromethyltrimethoxysilane.

Similarly, the mention can be made of silane compounds substituted with two hydrolyzable groups, such as dimethyldichlorosilane, dimethyldiaminosilane, dimethyldiacetoxysilane, dimethyldimethoxysilane, diphenyldimethoxysilane, dibutyldimethoxysilane or silane compounds substituted with one hydrolyzable group, such as trimethylchlorosilane, hexamethyldisilazane, trimethylsilane, tributylsilane, trimethylmethoxysilane, tributylethoxysilane and the like.

Examples of silane compounds having the polymerizable organic group $R^1$ in the non-hydrolyzable organic group X include (meth)acryloxysilane compounds such as (meth)acryloxypropyltrimethoxysilane, (meth)acryloxypropyltriethoxysilane, (meth)acryloxypropylmethyldimethoxysilane, (meth)acryloxypropyltrichlorosilane, bis(methacryloxypropyl)dimethoxysilane and the like; vinylsilane compounds such as vinyltrimethoxysilane, vinyltrichlorosilane, vinyltriethoxysilane, divinyldimethoxysilane, divinyldiethoxysilane and the like; epoxysilane compounds such as glycidyloxytrimethoxysilane, abis(glycidyloxy)dimethoxysilane, β-(3,4-epoxycyclohexyl)ethyltrimethoxysilane, β-(3,4-epoxycyclohexyl)ethyltriethoxysilane and the like; oxetane silane compounds such as 3-(3-methyl-3-oxetanemethoxy)propyltrimethoxysilane, 3-(3-ethyl-3-oxetanemethoxy)propyltriethoxysilane and the like; and silane compounds having a 6-membered-ring ether structure, such as oxacyclohexyltrimethoxysilane, oxacyclohexyltriethoxysilane and the like. These can be used alone or in combination thereof.

Examples of silane compounds having the polymerizable organic group $R^1$ in the hydrolyzable organic group X include tetra(meth)acryloxysilane, tetrakis[2-(meth)acryloxyethoxy]silane, tetraglycidyloxysilane, tetrakis(2-vinyloxyethoxy)silane, tetrakis(2-vinyloxybutoxy)silane, tetrakis(3-methyl-3-oxetanemethoxy)silane, methyltri(meth)acryloxysilane, methyl[2-(meth)acryloxyethoxy]silane, methyltriglycidyloxysilane, methyltris(3-methyl-3-oxetanemethoxy)silane and the like. These can be used alone or in combination thereof.

(2) Photo Acid Generator

① Definition

The photo acid generator (component B) used in the photo-curable composition of the first embodiment is defined as a compound which upon exposure to energy rays such as light, can release an acidic active substance capable of photo-curable (crosslinking) the hydrolyzable silane compound as component (A). The photo acid generator is sometimes abbreviated to PAG.

② Type of the Photo Acid Generator

The photo acid generator includes onium salts having the structure represented by the general formula (5) and sulphonic acid derivatives having the structure represented by the general formula (6).

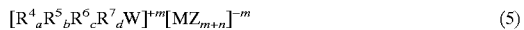

$$[R^4_a R^5_b R^6_c R^7_d W]^{+m}[MZ_{m+n}]^{-m} \quad (5)$$

wherein the cation is an onium ion, W is S, Se, Te, P, As, Sb, Bi, O, I, Br, Cl or —N≡N; $R^4$, $R^5$, $R^6$ and $R^7$ are the same or different organic groups; a, b, c and d each are an integer of 0 to 3 whereupon (a+b+c+d) is equal to the valence of W; M is a metal or metalloid constituting the central atom in the halogenated complex $[MX_{m+n}]$ and stands for B, P, As, Sb, Fe, Sn, Bi, Al, Ca, In, Ti, Zn, Sc, V, Cr, Mn, Co and the like; Z is a halogen atom such as F. Cl and Br or an aryl group; m is the net electric charge of the halogenated complex ion; and n is the valence of M.

$$Q_s—[S(=O)_2—R^8]_t \quad (6)$$

wherein Q is a monovalent or divalent organic group, $R^8$ is a monovalent organic group having 1 to 12 carbon atoms, s is 0 or 1, and t is 1 or 2.

③ Amount of the Photo acid Generator Added

The amount of the photo acid generator added is not particularly limited, but for example it is preferably in the range of 0.1 to 15 parts by weight relative to 100 parts by weight of component (A). If the amount of the photo acid generator added is less than 0.1 part by weight, the photo-curable property may be lowered to fail to achieve sufficient curing rate. On the other hand, if the amount of the photo acid generator exceeds 15 parts by weight, the weather-ability and heat resistance of the resulting cured product may be lowered.

Accordingly, from the viewpoint of further excellent balance between photo-curable property and the weather-ability and the like of the resulting cured product, the amount of the photo acid generator added is more preferably in the range of 1 to 10 parts by weight relative to 100 parts by weight of component (A).

(3) Dehydrating Agent

① Definition

The dehydrating agent used in the photo-curable composition of the first embodiment is defined as a compound for conversion into a compound other than water by chemical reaction or as a compound for eliminating adverse influence on the photo-curable property and storage stability by physical adsorption and inclusion.

That is, the contradictory characteristics of storage stability and the photo-curable property can be improved by containing such a dehydrating agent without impairing the weather-ability and heat resistance of the photo-curable composition. The reason is not clear but presumably because the storage stability of the photo-curable composition is improved due to the effective absorption of water by the dehydrating agent while in the condensation reaction as photo-curable reaction, generated water is effectively absorbed continuously into the dehydrating agent so that the photo-curable property of the photo-curable composition is improved.

② Type of Dehydrating Agent

The type of hydrating agent used in the first embodiment is not particularly limited, but as an organic compound, it is preferably at least one compound selected from the group consisting of carboxylates, acetals (including ketal compounds), and carboxylic anhydrides. As an inorganic compound, ceramic powder having a dehydrating function is also preferably used. These dehydrating agents have an excellent dehydrating effect, and the function of the dehydrating agent can be sufficiently demonstrated by adding it in a small amount.

The carboxylate as the dehydrating agent is selected from orthocarboxylate (orthocarboxylic acid ester), silyl carboxylate and the like.

Here, preferable orthocarboxylates include methyl orthoformate, ethyl orthoformate, propyl orthoformate, butyl orthoformate, methyl orthoacetate, ethyl orthoacetate, propyl orthoacetate, butyl orthoacetate, methyl orthopropionate and ethyl orthopropionate. Among these orthocarboxylates, orthoformate is particularly preferable from the viewpoint of the further excellent dehydration effect and the further improvement of storage stability and the photo-curable property.

The preferable silyl carboxylates include trimethyl silyl acetate, tributyl silyl acetate, trimethyl silyl formate, trimethyl silyl oxalate and the like.

Among carboxylates, orthocarboxylate is preferably used since it can absorb water effectively and can be self-hydrolyzed. Also, the formed compound from orthocarboxylate is neutral and orthocarboxylate can exhibit an excellent dehydrating effect to further improve the storage stability and the photo-curable property.

Preferable acetals include dimethyl acetal, diethyl acetal and dipropyl acetal which are reaction products between monoalcohol and ketone such as acetone, methyl ethyl ketone (MEK), diethyl ketone, methyl isobutyl ketone (MIBK), cyclohexanone, acetaldehyde, propionaldehyde, benzaldehyde, or acetals made from ketone and divalent alcohol such as ethylene glycol, and ketene silyl acetals produced by silylation of carboxylates and the like.

Among these acetals, acetone dimethyl acetal, acetone diethyl acetal, methyl ethyl ketone dimethyl acetal, methyl ethyl ketone dimethyl acetal, cyclohexanone dimethyl acetal and cyclohexanone diethyl acetal are preferably used as the dehydrating agent in the present invention from the viewpoint of their particularly excellent dehydrating effect and the further improvement of the photo-curable property.

Preferable carboxylic anhydrides include formic anhydride, acetic anhydride, succinic anhydride, maleic anhydride, phthalic anhydride, benzoic anhydride, acetic benzoic anhydride and the like. In particular, aceticanhydride and succinic anhydride are preferably by virtue of their superior dehydrating effect.

Preferable ceramic powders having a dehydrating function include silica gel particles, alumina particles, silica alumina particles, activated clay, zeolite and the like. These ceramic powders has strong affinity for water and can show excellent dehydrating effect.

③ States of the Dehydrating Agent

The dehydrating agent is a solid state or a liquid state under the conditions of normal temperatures and normal pressures, and is selected from compounds which are dissolved or suspended in the photo-curable composition to show the dehydrating effect.

If the dehydrating agent is selected from the organic compounds, its boiling point (under the condition of normal pressures) is preferably in the range of 40 to 200° C. When the boiling point is in such a range, the dehydrating agent can be evaporated sufficiently under dry conditions at room temperature (25° C.) to 200° C. Accordingly, the dehydrating agent can be easily removed afterwards.

On the other hand, if the dehydrating agent is selected from inorganic compounds, the photo-curable composition is uniformly dispersed such that its coating property and transparency are not impaired.

④ Amount of the Dehydrating Agent Added

The amount of the dehydrating agent added is not particularly limited, but usually, the amount is preferably in the range of 0.1 to 100 parts by weight relative to 100 parts by weight of component (A). If the amount of the dehydrating agent added is less than 0.1 part by weight, the effect of the dehydrating agent added may not be obtained, and the effect of improving the storage stability and the photo-curable property may be lowered. On the other hand, if the amount of the dehydrating agent added exceeds 100 parts by weight, the effect of improving the storage stability and the photo-curable property may be raised no more.

Accordingly, the amount of the dehydrating agent added is more preferably in the range of 0.5 to 50 parts and moreover preferably 1 to 10 parts by weight relative to 100 parts by weight of component (A).

(4) Additives and the Like

The photo-curable composition of the first embodiment can further contain the following additives alone or in combination thereof in such a range as not to impair the objects and effects of the present invention: radical photo-polymerization initiator, photosensitizer, organic solvent, polymerization inhibitor, polymerization initiation assistant; leveling agent; thixotropic agent; wetting improve agent; surface active agent (surfactant); plasticizer; UV absorber; antioxidant; antistatic agent; silane coupling agent; inorganic filler; pigment; and dye.

(5) Photo-Curable Composition

① States

The viscosity of the photo-curable composition of the first embodiment is preferably in the range of 5 to 10,000 cps (25° C.). If the viscosity exceeds this range, it may be difficult to form a uniform coating. Such viscosity can be suitably adjusted by varying the amount of a reactive diluent or organic solvent incorporated.

② Coating Method

When the photo-curable composition is applied to a substrate, a coating method is generally adopted. The coating method includes a dipping method, a spraying method, a bar coating method, a roll coating method, a spin coating method, a curtain coating method, a gravure printing method, a silk screening method, an ink jetting method and the like.

③ Irradiation

The means of irradiating the photo-curable composition of the first embodiment is not particularly limited, and various means can be used.

For example, the entire surface of a coating can be irradiated with a light by use of a light source such as a high-pressure mercury lamp, a low-pressure mercury lamp, a metal halide lamp, an eximer lamp and the like. Further, the photo-curable composition can be irradiated with a laser light or a scanned converged light from a lens, a mirror and the like. Further, the composition can be irradiated with a non-converged light through a mask having a predetermined pattern for penetrating light, or the photo-curable composition can be irradiated with a light via optical fibers corresponding to a predetermined pattern in a light-guide member having a large number of optical fibers bundled in it.

The photo-cured product (photo-cured film) obtained by photo-curable the composition can be further heated, if necessary. In this case, usually the film is heated preferably at a temperature of from room temperature to the temperature at which the base material or the film is initiated to be decomposed, for example at 50 to 200° C. for 5 minutes to 72 hours. By further heating the film after photo-curing, the photo-cured product which is further excellent in heat resistance and weather-ability can be obtained.

SECOND EMBODIMENT

The second embodiment of the present invention is a photo-curable composition comprising a condensate in hydrolyzates of hydrolyzable silane compounds represented by the general formula (1) (component A), a fluorine-containing polymer (component E) and a photo acid generator (component C). Hereinafter, the fluorine-containing polymer as a characterizing feature of the second embodiment is described.

(1) Type of the Fluorine-Containing Polymer

The type of the fluorine-containing polymer used in the second embodiment is not particularly limited insofar as it is a polymer containing a fluorine atom in the molecule, and preferable examples are preferably copolymers obtained from one or more fluorine-containing monomers such as fluorolefins, perfluoroalkyl vinyl ethers, perfluoroalkoxy alkyl vinyl ethers, fluoroalkyl vinyl ethers, fluoroalkoxy alkyl vinyl ethers, fluorine-containing (meth)acrylates.

(2) Copolymerization Components

For polymerization of the fluorine-containing polymer, it is preferable to copolymerize at least one copolymerization component selected from the group consisting of a monomer having a hydrolyzable silyl group, a monomer having an epoxy group, a monomer having an oxetane group, a monomer having a hydroxy group and a monomer having a carboxyl group.

By copolymerizing such copolymerization components, the compatibility between the fluorine-containing polymer and the hydrolyzable silane compound is improved, and further the fluorine-containing polymer and the hydrolyzable silane compound can also be reacted with each other.

Further, as a monomer having a hydrolyzable silyl group, the nonionic reactive emulsifier represented by the general formula (7) is preferably used.

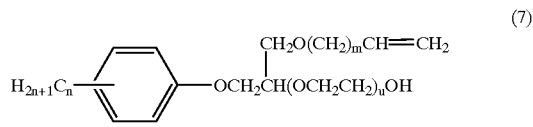

(7)

wherein n is an integer of 1 to 20, m is an integer of 1 to 10, and u is an integer of 1 to 50.

Preferable monomers having an oxetane group include the oxetane compound represented by the general formula (8):

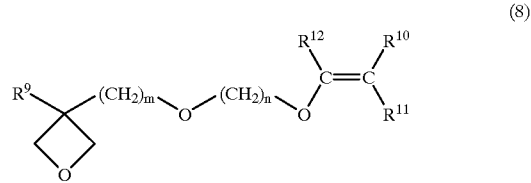

(8)

wherein the substituent group $R^9$ is a hydrogen atom, an alkyl group, a fluorine atom, a fluoroalkyl group, an allyl group, an aryl group, a furyl group or a thienyl group; the substituent groups $R^{10}$, $R^{11}$ and $R^{12}$ are independently a hydrogen atom or an alkyl group having 1 to 6 carbon atoms; and m and n each are an integer of 1 to 10.

From the viewpoint of further improvement of yield and easy control of fluorine contents, it is also preferable to copolymerize copolymerization components other than those above-described, for example, alkyl vinyl ethers such as methyl vinyl ether, ethyl vinyl ether, n-propyl vinyl ether and isopropyl vinyl ether, cycloalkyl vinyl ethers, vinyl carboxylates such as vinyl acetate, vinyl propionate, vinyl butyrate, vinyl pivalate and the like.

(3) Fluorine Content

Although the fluorine content in the fluorine-containing polymer is not particularly limited, its content is preferably in the range of 3 weight-% or more, more preferably 5 to 60%-weight. This is because if the fluorine content in the fluorine-containing polymer is less than 3 weight-%, the anti-reflective property may be lowered, and it may be difficult to control the refractive index in a wide range.

The fluorine content in the fluorine-containing polymer can be easily controlled by regulating the amount and by changing the type of fluorine-containing monomers used in polymerization. Note that the fluorine content in the fluorine-containing polymer can be determined by an alizarin complexometry.

(4) Intrinsic Viscosity

The intrinsic viscosity of the fluorine-containing polymer (This intrinsic viscosity is determined in N,N- dimethylacetamide at 25° C. This applies to every intrinsic viscosity mentioned hereinafter) is not particularly limited either, and its viscosity is preferably in the range of 0.05 to 2.5 dl/g.

The reason is that if the intrinsic viscosity is less than 0.05 dl/g, the mechanical strength of the resulting cured film may be inadequate. On the other hand, if the intrinsic viscosity exceeds 2.5 dl/g, the coating property of the photo-curable composition may be lowered thus making it difficult to form a thin film having uniform thickness.

Accordingly, from the viewpoint of further excellent balance between the mechanical strength of the fluorine-containing polymer and the formability of thin films, the. intrinsic viscosity of the fluorine-containing polymer is more preferably in the range of 0.1 to 2.0 dl/g.

(5) Weight Average Molecular Weight

Although the weight average molecular weight (Mw) of the fluorine-containing polymer is not particularly limited, its Mw is preferably in the range of 1,000 to 1,000,000. This is because if Mw is less than 1,000, adhesion to the substrate may be lowered. On the other hand, if Mw exceeds 1,000,000, the compatibility between the fluorine-containing polymer and the hydrolyzable silane compound may be poor.

Accordingly, from the viewpoint of further excellent balance between improvement of adhesion-to the substrate and compatibility thereof with the hydrolyzable silane compound, Mw of the fluorine-containing polymer is more preferably in the range of 3,000 to 500,000, moreover preferably is in the range of 5,000 to 300,000.

Note that Mw of the fluorine-containing polymer can be determined using polystyrene as molecular-weight standards by GPC (gel permeation chromatography).

(6) Glass Transition Temperature

Although the glass transition temperature (Tg) of the fluorine-containing polymer is not particularly limited, but it is preferably in the range of –100 to 120° C. This is because if Tg is less than –100° C., the cohesive force of the fluorine-containing polymer may be lowered and adhesion strength to the substrate may be lowered. On the other hand, if Tg exceeds 120° C., the adhesion strength to the substrate may be lowered.

Accordingly, from the viewpoint of further excellent balance between the cohesive force of the fluorine-containing polymer and the adhesion strength to the substrate, Tg of the fluorine-containing polymer is more preferably in the range of –80 to 100° C., moreover preferably is in the range of –40 to 50° C.

Note that Tg can be determined with a differential scanning calorimeter (DSC) at an increasing temperature rate of 10° C./min. in a nitrogen stream.

(7) Radical Polymerization of the Fluorine-Containing Polymer

The fluorine-containing polymer described above can be obtained by radical polymerization of fluorine-containing monomers and the like in the presence of a radical polymerization initiator (radical generator). Such radical polymerization includes a emulsion polymerization, a suspension polymerization, a bulk polymerization, a solution polymerization and the like. Also, the polymerization procedure in radical polymerization may be in a batch system, a semi-continuous system or a continues system depending on the object.

Further, azo group-containing polysiloxane compounds represented by the following general formula (9) are also preferably used as a radical polymerization initiator for radical polymerization of the fluorine-containing polymer.

Such radical polymerization initiator can be used to generate radical polymerization reaction and to easily introduce siloxane bonds into the resulting fluorine-containing polymer.

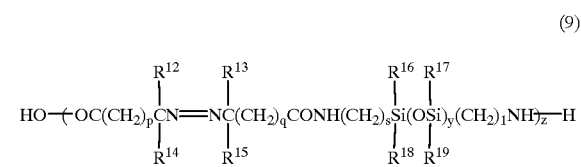

(9)

wherein $R^{12}$, $R^{13}$, and $R^{16}$ to $R^{19}$ each are a monovalent group containing 1 to 6 carbon atoms; $R^{14}$ and $R^{15}$ are —CN or —COOCH$_3$; p, q, s, y and t each are an integer of 1 to 6; and z is an integer of 1 to 20.

Specifically, the compound represented by the general formula (9) is preferably that represented by the following general formula (10).

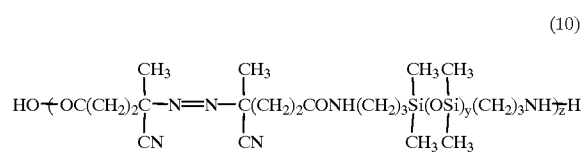

(10)

wherein y and z have the same meanings as in the general formula (9).

THIRD EMBODIMENT

The third embodiment of the present invention is a photo-curable composition comprising a condensate in hydrolyzates of hydrolyzable silane compounds represented by the general formula (1) (component A), a vinyl polymer containing hydrolyzable silyl groups (component F, hereinafter also called the vinyl polymer containing a silyl group) other than component A, and a photo acid generator (component C). Hereinafter, component F as the characterizing feature in the third embodiment is described.

(1) Type of the Vinyl Polymer Containing a Silyl Group and a Process for Producing the Same The vinyl polymer containing a silyl group is defined as a polymer consisting of vinyl monomers having at least one hydrolyzable silyl group in the molecule, as shown in the general formula (3) above. The hydrolyzable silyl group in the general formula (3) is the same as the hydrolyzable silyl group in the general formula (1).

The vinyl polymer containing a silyl group is obtained by allowing a vinyl polymer to react with hydrolyzable silyl groups, and for example the first and second production processes shown below are preferably used.

(The first production process)

The first production process is a process in which polymerizable unsaturated monomers containing a hydrolyzable silyl group are polymerized, or polymerizable unsaturated monomers containing hydrolyzable silyl groups and polymerizable unsaturated monomers free of hydrolyzable silyl groups are copolymerized.

(The second production process)

The second production process is a process in which a vinyl polymer containing reactive organic groups is chemically reacted with a compound containing a hydrolyzable silyl group. Specifically, the following methods can be used:

1) hydrosilylation reaction for adding trialkoxysilane to a polymer having unsaturated double bonds in the presence of a transition metal catalyst;

2) a method of adding an alkoxysilane containing mercapto groups or amino groups to addition-react with a polymer containing epoxy groups; and
3) a method of adding an alkoxysilane containing isocyanate groups to react with a polymer containing hydroxy groups followed by silylation thereof by urethane bonds.

(2) Amount of the vinyl polymer

Although the amount of the vinyl polymer containing a silyl group is not particularly limited, its amount is preferably in the range of 1 to 10,000 parts by weight relative to 100 parts by weight of component (A). This is because if the amount of the vinyl polymer containing a silyl group to be reacted is less than 1 part by weight, the adhesion strength to the substrate, flexibility, or resistance to chemicals may be poor, while if the amount exceeds 10,000 parts by weight, the photo-curable property of the photo-curable composition or the weather-ability of the resulting cured product may be poor. Accordingly, from the viewpoint of further excellent balance between the adhesion to the substrate and the weather-ability of the resulting cured product, the amount of the vinyl polymer containing a silyl group to be reacted is more preferably in the range of 5 to 200 parts by weight, moreover preferably is in the range of 10 to 100 parts by weight relative to 100 parts by weight of component (A).

(3) Weight Average Molecular Weight

Although the weight average molecular weight (Mw) of the vinyl polymer containing a silyl group is not particularly limited, it is preferably in the range of 1,000 to 1,000,000. This is because if Mw is less than 1,000, flexibility may be lowered, whereas if Mw exceeds 1,000,000, the cured film may be rendered poor in transparency. Accordingly, from the viewpoint of further excellent balance between the improvement of adhesion to the substrate and the transparency of the photo-cured product, Mw of the vinyl polymer containing a silyl group is more preferably in the range of 3,000 to 500,000 and moreover preferably is in the range of 5,000 to 50,000. Note that Mw can be determined by GPC using the polystyrene as molecular-weight standards.

(4) Glass Transition Temperature

The glass transition temperature (Tg) of the silyl group-containing vinyl polymer is not particularly limited, but it is preferably in the range of −100 to 120° C. This is because if Tg is less than −100° C., the cohesive force of the vinyl polymer may be lowered and the adhesion strength to the substrate also may be reduced, whereas if Tg exceeds 120° C., the vinyl polymer containing a silyl group may be rigid, and the adhesion strength to the substrate may also be reduced. Accordingly, from the viewpoint of further excellent balance between the cohesive force of the vinyl polymer containing a silyl group and the improvement of the adhesion to the substrate, Tg is more preferably in the range of −80 to 100° C. and moreover preferably is in the range of −40 to 50° C. Note that Tg can be measured with a DSC at an increasing temperature rate of 10° C./min. in a nitrogen stream.

FOURTH EMBODIMENT

The fourth embodiment of the present invention is a photo-curable composition comprising a condensate in hydrolyzates of hydrolyzable silane compounds represented by the general formula (1) (component A), a hydrolyzable silane compound containing an oxetane group (component G, hereinafter also called oxetane compound) other than component A, and a photo acid generator (component C).

Hereinafter, the hydrolyzable silane compound containing an oxetane group as a characterizing feature in the fourth embodiment is described.

(1) Type

The oxetane compound is a compound having both a hydrolyzable group and an oxetane group in the molecule, but it is preferably a compound represented by the general formula (11) or a compound represented by the general formula (12).

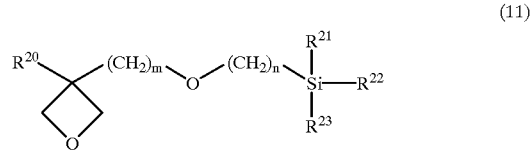

(11)

wherein the substituent group $R^{20}$ is a hydrogen atom, an alkyl group, a fluorine atom, a fluoroalkyl group, an allyl group, an aryl group, a furyl group or a thienyl group; the substituent groups $R^{21}$, $R^{22}$ and $R^{23}$ each are a hydrolyzable group; and m and n each are an integer of 1 to 10.

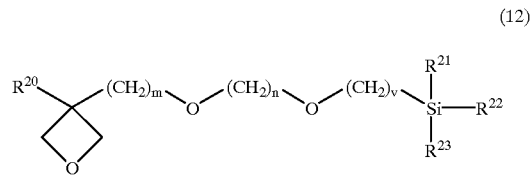

(12)

wherein the substituent groups $R^{20}$, $R^{21}$, $R^{22}$, $R^{23}$, m and n each have the same meanings as defined in the general formula (11), and v is an integer of 1 to 10.

(2) Examples

The specific oxetane compounds represented by the general formula (11) include: [(3-methyloxetane-3-yl)-methyloxypropyl]-triethoxysilane, [(3-methyloxetane-3-yl)-methyloxypropyl]-trimethoxysilane, [(3-methyloxetane-3-yl)-methyloxypropyl]-methyldiethoxysilane, [(3-methyloxetane-3-yl)-methyloxypropyl]-methyldimethoxysilane, [(3-methyloxetane-3-yl)-methyloxypropyl]-ethyldiethoxysilane, [(3-methyloxetane-3-yl)-methyloxypropyl]-ethyldimethoxysilane, [(3-ethyloxetane-3-yl)-methyloxypropyl]-triethoxysilane, [(3-ethyloxetane-3-yl)-methyloxypropyl]-trimethoxysilane, [(3-ethyloxetane-3-yl)-methyloxypropyl]-methyldiethoxysilane, [(3-ethyloxetane-3-yl)-methyloxypropyl]-methyldimethoxysilane, [(3-ethyloxetane-3-yl)-methyloxypropyl]-ethyldiethoxysilane, [(3-ethyloxetane-3-yl)-methyloxypropyl]-ethyldimethoxysilane, [(3-methyloxetane-3-yl)-methyloxybutyl]-triethoxysilane, [(3-methyloxetane-3-yl)-methyloxybutyl]-trimethoxysilane, [(3-methyloxetane-3-yl)-methyloxybutyl]-methyldiethoxysilane, [(3-methyloxetane-3-yl)-methyloxybutyl]-methyldimethoxysilane, [(3-methyloxetane-3-yl)-methyloxybutyl]-ethyldiethoxysilane, [(3-methyloxetane-3-yl)-methyloxybutyl]-ethyldimethoxysilane, [(3-ethyloxetane-3-yl)-propyloxypropyl]-triethoxysilane, [(3-ethyloxetane-3-yl)-propyloxypropyl]-trimethoxysilane, [(3-ethyloxetane-3-yl)-propyloxypropyl]-methyldiethoxysilane, [(3-ethyloxetane-3-yl)-propyloxypropyl]-methyldimethoxysilane, [(3-ethyloxetane-3-yl)-propyloxypropyl]-ethyldiethoxysilane, [(3-ethyloxetane-3-yl)-propyloxypropyl]-ethyldimethoxysilane and the like.

Further, more specific oxetane compounds having hydrolyzable groups, represented by the general formula (12), include: 2-[(3-methyloxetane-3-yl)-methyloxypropyl]-ethoxyethyltrimethoxysilane, 2-[(3-methyloxetane-3-yl)-methyloxypropyl]-ethoxyethyltriethoxysilane, 2-[(3-methyloxetane-3-yl)-methyloxypropyl]-ethoxyethyldimethoxysilane, 2-[(3-methyloxetane-3-yl)-methyloxypropyl]-ethoxyethylmethyldiethoxysilane and the like.

(3) Hydrolyzable Group

Although the hydrolyzable group in the oxetane compound is not particularly limited, for example, it is preferably a group forming a silanol group (—SiOH) by hydrolysis. Accordingly, the oxetane compound preferably possesses a group having a hydrolyzable group capable of forming a silanol group, that is, a hydrolyzable silyl group.

Accordingly, when the oxetane compound possesses a hydrolyzable silyl group, the hydrolyzable group ($R^{21}$, $R^{22}$, $R^{23}$ in the general formulae (11) and (12)) can react with water, or can react with water in the presence of an acid, a base or any other catalyst, to form a silanol group.

The hydrolyzable group in the oxetane compound includes carboxylate groups such as an alkoxy group, an acetoxy group; halogen groups such as a chloro group; an aminosilyl group; an oxime group; a hydride group. Particularly preferable among those is an alkoxy group, the most preferably is an alkoxy group having 1 to 6 carbon atoms.

The hydrolyzable groups $R^{12}$, $R^{22}$ and $R^{23}$ in the general formulae (11) and (12) may be independently the same or different.

(4) Amount of the Oxetane Compound Added

Although the amount of the oxetane compound added is not particularly limited, its amount is preferably in the range of 1 to 250 parts by weight relative to 100 parts by weight of metal oxide particles. This is because if the amount of the oxetane compound added is less than 1 part by weight, the effect of the oxetane compound may not be exhibited, whereas if added in an amount exceeding 250 parts by weight, the storage stability and the coating property may be lowered.

Accordingly, from the viewpoint of certain achievement of the addition effect and further excellent storage stability, the amount of the oxetane compound added is more preferably in the range of 5 to 200 parts by weight, moreover preferably is in the range of 10 to 100 parts by weight relative to 100 parts by weight of metal oxide particles.

FIFTH EMBODIMENT

The fifth embodiment of the present invention is a photo-curable composition comprising a hydrolyzate of a hydrolyzable silane compound (component A), a photo acid generator (component B), a dehydrating agent (component C) and a hydrolyzable titanium compound (component H, hereinafter also called titanium compound). By adding silica particles in this way, the cure shrinkage of the resulting cured film can be effectively reduced. Further, the mechanical strength of the cured film, for example, Young's modulus of elasticity, can be easily increased to improve the scratch resistance.

(1) Structure

The hydrolyzate of the titanium compound is a compound where in the titanium compound of the above-described general formula (4), a titanol group has been formed.

In the general formula (4), the four hydrolyzable groups represented by Y may be the same or different, and the specific type of hydrolyzable group Y may be the same as the hydrolyzable group X in the general formula (1). Accordingly, a detailed description of the type and the like of hydrolyzable group Y here is omitted.

Further, a part of the hydrolyzable groups Y may remain non-hydrolyzed similar to the hydrolyzable group X in the general formula (1), or some titanol groups may be condensed with each other to form a partially condensed product.

The hydrolysis conditions and the like for the hydrolyzable group Y may also be the same as for the hydrolyzable group X in the general formula (1).

Further, the hydrolyzable group Y in the hydrolyzable titanium compound and the silanol group in the hydrolyzable silane compound of the general formula (1) may be condensed.

(2) Examples

Hereinafter, examples of hydrolyzable titanium compounds represented by the general formula (4) are described.

Such titanium compounds include titanium compounds in the general formula (4), the four hydrolyzable groups Y are respectively non-polymerizable hydrolyzable groups. Specifically, the mention may be made of o-allyloxy (polyethyleneoxy)triisopropoxy titanium, allyl acetoacetate triisopropoxy titanium, bis(triethanolamine)diisopropoxy titanium, tetra n-butoxy titanium, chlorotriisopropoxy titanium, bis(2,4-pentanedionate) di-n-butoxy titanium, dichlorodiethoxy titanium, bis(2,4-pentanedionate) diisopropoxy titanium, bis(tetramethylheptanedionate) diisopropoxy titanium, bis(ethyl acetate) diisopropoxy titanium, tetraethoxy titanium, tetrakis(2-ethylhexanoxy) titanium, tetraisobutoxy titanium, tetraisopropoxy titanium, titanium lactate, tetramethoxy titanium, tetramethoxy propoxy titanium, tetramethyl phenoxy titanium, tetra n-nonyloxy titanium, bis(2,4-pentanedionate) titanium oxide, tetra n-propoxy titanium, tetrastearyloxy titanium, tetrakis(bis-2, 2-(allyloxymethyl)butoxy) titanium, tri n-butylstannoxy triisopropoxy titanium, tri(isostearoyl) isopropoxy titanium, tetrakis(trimethylsiloxy) titanium and the like.

Similarly, mention can be made of titanium compounds out of the four hydrolyzable groups Y in the general formula (4), at least one hydrolyzable group is polymerizable. Specifically, mention may be made of methacryloxy triisopropoxy titanium, 2-methacryloxy ethyl acetoacetate triisopropoxy titanium, methacryloxy ethoxy triisopropoxy titanium, 2-methoxyethoxyethoxy trimethacrylate titanium and the like.

Among the titanium compounds described above, compounds having a hydrolyzable group having a relatively few carbon atoms, such as tetramethoxy titanium, tetraethoxy titanium, tetra n-propoxy titanium, tetraisopropoxy titanium, tetra n-butoxy titanium and the like or those having a benzene ring as a hydrolyzable group, such as tetramethyl phenoxy titanium are preferably used when a relatively high refractive index (1.60 or more) is desired for a cured film obtained by photo-curable the photo polymerizable composition.

On the other hand, when a relatively low refractive index (less than 1.60) is desired for a cured film obtained by photo-curable the photo polymerizable composition, it is preferable to use the compounds having a hydrolyzable group containing a relatively large number of carbon atoms, such as tetra n-nonyloxy titanium, tetrastearyloxy titanium, tetrakis[bis-2,2-(allyloxymethyl)butoxy]titanium and tri (isostearyloyl)isopropoxy titanium out of the above-described titanium compounds.

(3) Amount of the Titanium Added

Although the amount of the titanium added is not particularly limited, the ratio of component (A)/component (B)

by weight is preferably in the range of 99/1 to 1/99. This is because if the amount of the titanium compound added is less than 99/1 in terms of the ratio of component (A)/component (B) by weight, it may become difficult to control the refractive index, whereas if it exceeds 1/99, the photo-curable property and the storage stability may be lowered.

Accordingly, the amount of the titanium compound added is more preferably in the range of 90/10 to 10/90, moreover preferably in the range of 80/20 to 20/80, and specifically preferably in the range of 70/30 to 30/70 in terms of the ratio of component (A)/component (B) by weight.

SIXTH EMBODIMENT

The sixth embodiment of the present invention is a photo-curable composition comprising a hydrolyzate of a hydrolyzable silane compound(component A), a photo acid generator (component B), a dehydrating agent (component C) and silica particles (component I). By adding silica particles in this way, the cure shrinkage of the resulting cured film can be effectively reduced. Further, the mechanical strength of the cured film, for example Young's modulus of elasticity, can be effectively increased to improve the scratch resistance.

(1) Amount of the Silica Particles Added

Although the amount of the silica particles added is not particularly limited, it is preferably in the range of 10 to 250 parts by weight relative to 100 parts by weight of component (A).

If the amount of the silica particles added is less than 10 parts by weight, the effect of silica particles added may be low, whereas if it exceeds 250 parts by weight, the storage stability and the coating property may be lowered.

Accordingly, from the viewpoint of certain achievement of the addition effect and further excellent storage stability, the amount of the silica particles added is more preferably in the range of 20 to 200 parts by weight, the most preferably is in the range of 30 to 150 parts by weight, relative to 100 parts by weight of component (A).

(2) Type

Further, the silica particles may be any particles based on silica, and may contain other components than silica. Such other components than silica maybe alkali metal oxides, alkaline earth oxides, and oxides of Ti, Zr, Al, B, Sn, P and the like.

The average particle diameter of silica particles is preferably in the range of 0.001 to 20 $\mu$m. Further, when the silica particles are used to form a transparent photo-curable composition or a transparent cured film, the average particle diameter is preferably in the range of 0.001 to 0.2 $\mu$m, more preferably in the range of 0.001 to 0.01 $\mu$m.

Silica particles are preferably selected from the view point that the difference between the refractive index of silica particles (25° C., Na-D rays; this also applies to every refractive index mentioned below) and the refractive index of the photo-curable composition is 0.02 (–) or less. By use of the silica particles having such refractive index, the transparency of the resulting cured film can further be raised.

The specific surface area of silica particles is preferably in the range of 0.1 to 3,000 $m^2$/g and more preferably in the range of 10 to 1500 $m^2$/g.

The shape of silica particles is not particularly limited either, but the silica particles are preferably in at least one shape selected from the group consisting of spherical, hollow, porous, bar-shaped, plate-shaped, fibrous and amorphous. However, from the viewpoint of further excellent dispersibility, spherical silica particles are preferably used.

(3) Adding Way of the Silica Particles

The adding way of the silica particles is not particularly limited, but for example the silica particles can be used not only in a dry state but also in a dispersed state in water or in an organic solvent.

Further, a dispersion of fine silica particles known as colloidal silica in the art can also be directly used. For the object of particularly pursuing transparency, use of colloidal silica is preferable.

If the solvent for dispersion of colloidal silica is water, its hydrogen ion concentration in terms of pH is preferably in the range of 2 to 13, more preferably 3 to 7.

If the solvent for dispersion of colloidal silica is an organic solvent, the organic solvent may be methanol, ethanol, isopropanol, ethylene glycol, butanol, ethylene glycol monopropyl ether, methyl ethyl ketone(MEK), methyl isobutyl ketone(MIBK), toluene, xylene, dimethylformamide and the like, or mixtures thereof with organic solvents compatible therewith or as mixtures thereof with water. Preferable dispersion solvents are methanol, isopropanol, methyl ethyl ketone(abbreviated hereinafter to MEK), xylene and the like.

SEVENTH EMBODIMENT

The seventh embodiment of the present invention is a photo-curable composition comprising a hydrolyzate of a hydrolyzable silane compound(component A), a photo acid generator (component B), a dehydrating agent (component C) and a reactive diluent. By adding the reactive diluent in this way, the cure shrinkage of the resulting cured film can be effectively reduced, and the mechanical strength of the cured film can be regulated. Also, if a radical-polymerizable reactive diluent is used, the photo-reactivity can be easily regulated by further adding a radical initiator. Moreover, if a cationic-polymerizable reactive diluent is used, photo-reactivity and mechanical characteristics can be easily regulated.

(1) Amount of the Reactive Diluent Added

The amount of the reactive diluent added is not particularly limited, but for example, it is preferably in the range of 0.1 to 50 parts by weight relative to 100 parts by weight of component (A). If the amount is less than 1 part by weight, the effect of the reactive diluent added may be not exhibited, whereas given more than 50 parts by weight, the weatherability of the resulting cured film may be lowered. Accordingly, the amount of the reactive diluent incorporated added is more preferably in the range of 1 to 30 parts by weight, the most preferably is in the range of 2 to 20 parts by weight.

(2) Type

With respect to the type of reactive diluent, a cationic polymerizable monomer and an ethylenically unsaturated monomer or either monomer is preferably incorporated as the reactive diluent.

As the reactive diluent herein used, the cationic polymerizable monomer is defined as an organic compound causing polymerization reaction and crosslinking reaction upon exposure to light in the presence of a photo acid generator. Accordingly, the mention can be made of epoxy compounds, oxetane compounds, oxorane compounds, cyclic acetal compounds, cyclic lactone compounds, thierane compounds, thiethane compounds, vinyl ether compounds, spiro-orthoester compounds as reaction products between epoxy compounds and lactone, ethylenically unsaturated compounds, cyclic ether compounds, cyclic thioether compounds, vinyl compounds and the like. These cationic polymerizable monomers may be used alone or in combination thereof.

Further, the ethylenically unsaturated monomer as the reactive diluent is a compound having an ethylenically unsaturated bond (C=C) in the molecule, which is defined as a monofunctional monomer having one ethylenically unsaturated bond in one molecule and as a polyfunctional monomer having two or more ethylenically unsaturated bonds in one molecule.

EXAMPLES

Hereinafter, the Examples of the present invention are described, but the present invention is not limited to the description of the Examples. In the Examples, the amount of each component incorporated is expressed in parts by weight unless otherwise specified.

Example 1

(Preparation of a photo-curable composition)

80.0 g (0.558 mol) of Methyltrimethoxysilane (abbreviated hereinafter to MTMS) and 16.0 g (0.889 mol) of deionized water having an electrical conductivity of $8 \times 10^{-5}$ S·cm$^{-1}$ were placed in a vessel equipped with a stirrer, and then MTMS was hydrolyzed under stirring by heating at 60° C. for 6 hours. Then, while methyl isobutyl ketone (abbreviated hereinafter to MIBK) was added dropwise to it, methanol formed as a byproduct by hydrolysis was removed by distillation. A solution (referred to hereinafter as polysiloxane solution 1) containing polysiloxane as component (A) with the solid content adjusted finally to 22% by weight was thus obtained. The weight average molecular weight of the resulting polysiloxane solution 1 was 1500 as determined by GPC.

Then, 0.7 part by weight of a photo acid generator CD1012 (Sartomer) as component (B) and 3.0 parts by weight of a dehydrating agent methyl orthoformate as component (C) were added respectively to 100 parts by weight of polysiloxane solution 1 (including solvent) whereby a photo-curable composition was obtained.

In Table 1, the polysiloxane solution, which is shown as component (A), means a solution containing polysiloxane as component (A). In the Examples described below, the solid content is adjusted to 22% by weight unless otherwise specified, and in Table 1 and so on, a solution containing polysiloxane as component (A) is expressed as component (A).

(Evaluation of the photo-curable composition)

(1) Photo-Curable Properties

The resulting photo-curable composition was applied by using a bar coater onto a quartz plate under the atmosphere to form a coating of 3 μm in thickness.

The formed coating was irradiated with UV rays under the atmosphere at 25° C. with 100 mJ/cm$^2$ (irradiation time, 1 second), 200 mJ/cm$^2$ (irradiation time, 2 seconds), or 300 mJ/cm$^2$ (irradiation time, 3 seconds) under a conveyer type high-pressure mercury lamp to form a cured film. Each cured film thus obtained was examined for surface tack with fingers, and its photo-curable properties were examined in the following criteria. The results are shown in Table 1.

Very good: Surface tack is not observed on the cured film after irradiated with 100 mJ/cm$^2$.

Good: Surface tack is not observed on the cured film after irradiated with 200 mJ/cm$^2$.

Fair: Surface tack is not observed on the cured film after irradiated with 300 mJ/cm$^2$.

Bad: Surface tack is observed on the cured film after irradiated with 300 mJ/cm$^2$.

(2) Transparency

The photo-curable composition was spin-coated onto a quartz plate and irradiated with UV rays with 200 mJ/cm$^2$ under the conveyer type high-pressure mercury lamp (2 kW, Oak Co., Ltd.), to form a cured film of 10 μm in thickness. Its optical transmittance (T/%) at a wavelength of 550 nm was determined by using an spectrophotometer, and from the optical transmittance, transparency was examined in the following criteria. The results are shown in Table 1.

Good: Optical transmittance is 95% or more.
Fair: Optical transmittance is 80 to 95% or less.
Bad: Optical transmittance is less than 80%.

(3) Weather-Ability

The photo-curable composition was spin-coated onto a quartz plate and irradiated with UV rays with 200 mJ/cm$^2$ under the conveyer type high-pressure mercury lamp, to form a cured film of 5 μm in thickness. The resulting cured film was examined in an accelerated weathering test (humidity, 50%; temperature, 63° C.; rainfall, 18 minutes/irradiation, 120 minutes) in accordance with JIS D0205 by use of a sunshine carbon ark lamp type light resistance tester. Then, the appearance of the cured film after 1,000 hours of the accelerated weathering test was observed with eyes, and its weather-ability was examined in the following criteria. Further, the degree of yellowness thereof in accordance with JIS K7103 was determined in terms of ΔYI, and its weather-ability was examined in the same manner. The results are shown in Table 1.

Good: There is no change(no cracking) in appearance or ΔYI is 2 or less.

Bad: There is a change (cracking and the like) in appearance or ΔYI exceeds 2.

(4) Heat Resistance

The photo-curable composition was spin-coated onto a silicon wafer and irradiated with UV rays with 200 mJ/cm$^2$ under the conveyer type high-pressure mercury lamp, to form a cured film of 5 μm in thickness. Each cured film thus obtained was stored for 1 hour in a hot-air dryer at 250° C. or 400° C., and from the absence or presence of an abnormal appearance of the film under a microscope (50 magnifications), its heat resistance was examined on the basis of the following criteria. The results are shown in Table 1.

Very good: No cracking is observed after heating at 400° C.
Good: No cracking is observed after heating at 250° C.
Bad: Crackings are observed after heating at 250° C.

(5) Scratch Resistance (Pencil hardness)

The photo-curable composition was spin-coated onto a quartz plate and irradiated with UV rays with 200 mJ/cm$^2$ to form a cured film of 3 μm in thickness. The pencil hardness of each of the cured films thus obtained was determined according to JIS K5400, to evaluate its scratch resistance. For this evaluation, flaws on the surface thereof was observed with eyes. The results are shown in Table 1.

(6) Refractive Index

The photo-curable composition was applied by using a bar coater onto a tetrafluoroethylene(Teflon) film and then irradiated with UV rays with 200 mJ/cm$^2$ to form a cured film of 20 μm in thickness. The refractive index of the resulting cured film toward Na-D rays was determined at 250° C. in an Abbe's refractometer. As a result, the refractive index of 1.417 was obtained.

(7) Storage Stability

The photo-curable composition was stored at 40° C. for 1 month or 3 months, and its change in appearance (increase in viscosity) was visually checked. Further its photo-curable properties were measured in accordance with item (1) above, and its storage stability was examined in the following criteria. The results are shown in Table 1.

Very good: No change in the appearance and the photo-curable property after 3 months.

Good: No change in the appearance and the photo-curable property after 1 month.

Bad: A change in the appearance and a reduction in the photo-curable property after 1 month.

As can be seen from the results, it was confirmed that by adding the dehydrating agent (component C), the storage stability of the photo-curable composition is improved and the effect of improving the photo-curable property is obtained. Furthermore, the resulting film was confirmed to have the excellent weather-ability, the scratch resistance and the heat resistance. Such effects are further evident in view of comparison with the results of Comparative Example 1 described below.

Examples 2 to 4

In Examples 2 to 4, the influence of the type and amount of the photo acid generator, the type of the dehydrating agent, and the type and amount of the sensitizer were examined. That is, polysiloxane solution 1 was prepared in the same manner as in Example 1, and the photo-curable compositions in Examples 2 to 4 were prepared respectively using the formulation compositions shown in Table 1. Then, the resulting photo-curable compositions were examined for their photo-curable properties, the storage stability and the like in the same manner as in Example 1.

As can be seen from the results of Examples 2 to 4, it was confirmed that even if the type of the dehydrating agent (component C) is changed, the excellent storage stability and the photo-curable property of the photo-curable compositions, and the weather-ability, the scratch resistance and the heat resistance of the cured films are respectively obtained.

Examples 5 to 6

Preparation of Photo-Curable Compositions

In Examples 5 to 6, the type of the hydrolyzable silane compound, the type and amount of the photo acid generator, and the influence of the reactive diluent were examined. That is, 79.92 g (0.588 mol) of MTMS, 5.30 g (0.0173 mol) of 3-(3-methyl-3-oxetanemethoxy)propyltriethoxysilane, and 16.34 g (0.908 mol) of deionized water having an electrical conductivity of $8 \times 10^{-5}$ S·cm$^{-1}$ were placed in a vessel equipped with a stirrer, and then hydrolysis was conducted under stirring by heating at 60° C. for 6 hours. Then, while MIBK was added dropwise to it, methanol and ethanol formed as byproducts by hydrolysis were removed by distillation. A solution containing polysiloxane as component (A) (referred to hereinafter as polysiloxane solution 2) was thus obtained. The weight average molecular weight of the resulting polysiloxane solution 2, as determined by GPC was 2,000.

Then, in Example 5, 0.7 part by weight of a photo acid generator CD1012 as component (B), 3.0 parts by weight of a dehydrating agent methyl orthoformate as component (C), and 0.01 part by weight of diethyl thioxanthone as a sensitizer were added respectively to 100 parts by weight of polysiloxane solution 2 whereby a photo-curable composition was obtained.

Then, in Example 6, 0.7 part by weight of a photo acid generator CD1012 and 0.1 part by weight of a photo acid generator NDI-105 (Midori Kagaku K.K.) were added respectively to 100 parts by weight of polysiloxane solution 2. Further, 3.0 parts by weight of a dehydrating agent methyl orthoformate as component (C), 0.01 part by weight of diethyl thioxanthone as a sensitizer, and 2.2 parts by weight of an epoxy monomer as a reactive diluent were added respectively to 100 parts by weight of polysiloxane solution 5, and a photo-curable composition was obtained.

(Evaluation of the photo-curable compositions)

The resulting photo-curable compositions were examined for their photo-curable properties, the storage stability and the like in the same manner as in Example 1. The results are shown in Table 1.

Example 7

(Preparation of a photo-curable composition)

In Example 7, the influence of colloidal silica was examined. That is, 330.0 g (2.426 mol) of MTMS, 190.0 g of colloidal silica dispersed in methanol (silica content of 30%; a methanol silica sol produced by Nissan Chemical Industries, Ltd.), and 70.0 g (3.889 mol) of deionized water having an electrical conductivity of $8 \times 10^{-5}$ S·cm$^{-1}$ were placed in a vessel equipped with a stirrer, and then hydrolysis was conducted under stirring by heating at 60° C. for 6 hours. Then, while MIBK was added dropwise to it, methanol formed as a byproduct by hydrolysis was removed by distillation. A solution containing polysiloxane as component (A) of the present invention (referred to hereinafter as polysiloxane solution 3) was thus obtained. The weight average molecular weight of the resulting polysiloxane solution 3 was 1,500 as determined by GPC. The silica content in the solid content in the polysiloxane solution 3 was 26% by weight.

Then, 0.7 part by weight of a photo acid generator CD1012 as component (B), 3.0 parts by weight of a dehydrating agent methyl orthoformate as component (C), and 0.01 part by weight of diethyl thioxanthone as a sensitizer were added respectively to 100 parts by weight of polysiloxane solution 3 whereby a photo-curable composition was obtained.

(Evaluation of the photo-curable composition)

The resulting photo-curable composition was examined for the photo-curable properties, the storage stability and the like in the same manner as in Example 1. The results are shown in Table 2.

As can be seen from the results, it was confirmed that the scratch resistance of the cured film is further improved by incorporating silica particles. This effect is further clarified in view of the results of Example 7 and the results of Example 6 above and Example 8 below.

Example 8

(Preparation of a photo-curable composition)

In Example 8, the influence of colloidal silica was further examined. That is, 53.28 g (0.3918 mol) of MTMS, 133.2 g of colloidal silica dispersed in methanol (silica content of 30%; a methanol silica sol produced by Nissan Chemical Industries, Ltd.), and 11.28 g (0.627 mol) of deionized water having an electrical conductivity of $8 \times 10^{-5}$ S·cm$^{-1}$ were placed in a vessel equipped with a stirrer, and then hydrolysis was conducted under stirring by heating at 60° C. for 6 hours. Then, while MIBK was added dropwise to it, methanol formed as a byproduct by hydrolysis was removed by distillation. A solution containing polysiloxane as component (A) (referred to hereinafter as polysiloxane solution 4) was thus obtained. The weight average molecular weight of the resulting polysiloxane solution 4 was 1,800 as determined by GPC. The silica content in the solid content in the polysiloxane solution 4 was 60% by weight.

Then, 0.7 part by weight of a photo acid generator CD1012 as component (B), 3.0 parts by weight of a dehydrating agent methyl orthoformate as component (C), and 0.01 part by weight of diethyl thioxanthone as a sensitizer were added respectively to 100 parts by weight of polysiloxane solution 4 whereby a photo-curable composition was obtained.

(Evaluation of the photo-curable composition)

The resulting photo-curable composition was examined for the photo-curable properties, the storage stability and the like in the same manner as in Example 1. The results are shown in Table 2.

Example 9

(Preparation of a photo-curable composition)

In Example 9, the influences of the type of colloidal silica and the hydrolyzable silane compound were examined. That is, 79.92 g (0.588 mol) of MTMS, 5.30 g (0.0173 mol) of 3-(3-methyl-3-oxetanemethoxy)- propyltriethoxysilane, 30.0 g of colloidal silica dispersed in methanol (silica content of 30%; a methanol silica sol produced by Nissan Chemical Industries, Ltd.), and 16.34 g (0.908 mol) of deionized water having an electrical conductivity of $8 \times 10^{-5}$ $S \cdot cm^{-1}$ were placed in a vessel equipped with a stirrer, and then hydrolysis was conducted under stirring by heating at 60° C. for 6 hours. Then, while MIBK was added dropwise to it, methanol formed as a byproduct by hydrolysis was removed by distillation. A solution containing polysiloxane as component (A) (referred to hereinafter as polysiloxane solution 5) was thus obtained. The weight average molecular weight of the resulting polysiloxane solution 5 was 1,300 as determined by GPC. The silica content in the solid content in the polysiloxane solution 5 was 26% by weight.

Then, 0.7 part by weight of a photo acid generator CD1012 as component (B), 3.0 parts by weight of a dehydrating agent methyl orthoformate as component (C), and 0.03 part by weight of diethyl thioxanthone as a sensitizer were added respectively to 100 parts by weight of polysiloxane solution 5 whereby a photo-curable composition was obtained.

(Evaluation of the photo-curable composition)

The resulting photo-curable composition was examined for photo-curable properties, the storage stability and the like in the same manner as in Example 1. The results are shown in Table 2.

Comparative Example 1

Polysiloxane solution 1 was prepared in the same manner as in Example 1. Then, 0.7 part by weight of a photo acid generator CD1012 was added to 100 parts by weight of the resulting polysiloxane solution 1 whereby a photo-curable composition was obtained. That is, the dehydrating agent was not used in Comparative Example 1 unlike Example 1. Further, the resulting photo-curable composition was examined for the photo-curable properties, the storage stability and the like in the same manner as in Example 1. The results are shown in Table 1.

From comparison with the results in Example 1, it was confirmed that because the dehydrating agent is not used in Comparative Example 1, the photo-curable properties and the storage stability of the photo-curable composition relatively was poor.

Comparative Example 2

Polysiloxane solution 2 was prepared in the same manner as in Example 5. Then, 0.7 part by weight of a photo acid generator CD1012, 0.1 part by weight of a photo acid generator SP-170 (Asahi Denka Kogyo K.K.), 0.01 part by weight of diethyl thioxanthone as an sensitizer, and 2.2 parts by weight of epoxy monomer KBR2110 (Asahi Denka Kogyo K.K.) were added respectively to 100 parts by weight of the resulting polysiloxane solution 2 whereby a photo-curable composition was obtained. The resulting photo-curable composition was examined for the photo-curable properties, the storage stability and the like in the same manner as in Example 1.

As a result, it was confirmed that because the dehydrating agent is not added in Comparative Example 2, the photo-curable properties and the storage stability of the photo-curable composition or the scratch resistance of the cured film relatively was poor.

Example 10

(Preparation of a photo-curable composition)

In Example 10, a non-solvent type photo-curable composition was examined. That is, 79.92 g (0.588 mol) of MTMS, 5.30 g (0.0173 mol) of 3-(3-methyl-3-oxetanemethoxy) propyltriethoxysilane, and 16.34 g (0.908 mol) of deionized water having an electrical conductivity of $8 \times 10^{-5}$ $S \cdot cm^{-1}$, were placed in a vessel equipped with a stirrer, and then hydrolysis was conducted under stirring by heating at 60° C. for 6 hours. Then, methanol and ethanol formed as byproducts by hydrolysis without adding organic solvent were removed under the conditions of 40° C. and 1 mmHg pressure.

The polysiloxane (referred to hereinafter as polysiloxane 6) as component (A) was thus obtained. The viscosity of the resulting polysiloxane 6 was 400 cps (25° C.). The weight average molecular weight of the resulting polysiloxane 6 was 2,000 as determined by GPC.

Then, 0.7 part by weight of a photo acid generator CD1012 as component (B), 3.0 parts by weight of a dehydrating agent methyl orthoformate as component (C), and 0.01 part by weight of diethyl thioxanthone as a sensitizer were added respectively to 100 parts by weight of the resulting polysiloxane 6 whereby a photo-curable composition was obtained. The resulting photo-curable composition was examined for the photo-curable properties and the like in the same manner as in Example 1.

As can be seen from the obtained results, it was confirmed that the photo-curable composition having the excellent photo-curable properties and the storage stability can be obtained even in the absence of solvent.

TABLE 1

|  | Example 1 | Example 2 | Example 3 | Example 4 | Example 5 | Example 6 | Comparative Example 1 | Comparative Example 2 |
| --- | --- | --- | --- | --- | --- | --- | --- | --- |
| Component (A) | | | | | | | | |
| Polysiloxane solution 1 | 100 | 100 | 100 | 100 | | | 100 | |
| Polysiloxane solution 2 | | | | | 100 | 100 | | 100 |

TABLE 1-continued

|  | Example 1 | Example 2 | Example 3 | Example 4 | Example 5 | Example 6 | Comparative Example 1 | Comparative Example 2 |
|---|---|---|---|---|---|---|---|---|
| Component (B) |  |  |  |  |  |  |  |  |
| Photo acid generator 1 | 0.7 |  | 0.7 | 0.7 | 0.7 | 0.7 | 0.7 | 0.7 |
| Photo acid generator 2 |  | 1.4 |  |  |  | 0.1 |  |  |
| Component (C) |  |  |  |  |  |  |  |  |
| Methyl orthoformate | 3 | 3 |  |  | 3 | 3 |  |  |
| Methyl orthoacetate |  |  | 3 |  |  |  |  |  |
| Acetone diethyl ketal |  |  |  | 3 |  |  |  |  |
| Sensitizer |  |  |  |  |  |  |  |  |
| Dibromo anthracene |  | 0.7 |  |  |  |  |  |  |
| Diethyl thioxanthone |  |  | 0.01 | 0.01 | 0.01 | 0.01 |  | 0.01 |
| Reactive diluent |  |  |  |  |  |  |  |  |
| Epoxy mononer |  |  |  |  |  |  |  | 2.2 |
| Evaluation |  |  |  |  |  |  |  |  |
| Photo-curable properties | Very good | Very good | Very good | Very good | Very good | Very good | Fair | Fair |
| Transparency | Good | Good | Good | Good | Good | Good | Good | Good |
| Weather-ability | Good | Good | Good | Good | Good | Good | Good | Good |
| Heat resistance | Very good | Very good | Very good | Very good | Very good | Good | Very good | Good |
| Pencil hardness | 3H | 3H | 4H | 4H | 4H | 3H | 3H | H |
| Storage stability | Very good | Very good | Very good | Very good | Very good | Very good | Bad | Bad |

TABLE 2

|  |  | Example 7 | Example 8 | Example 9 | Example 10 |
|---|---|---|---|---|---|
| Component (A) |  |  |  |  |  |
| Polysiloxane solution 3 |  | 100 |  |  |  |
| Polysiloxane solution 4 |  |  | 100 |  |  |
| Polysiloxane solution 5 |  |  |  | 100 |  |
| Polysiloxane 6 |  |  |  |  | 100 |
| Component (B) |  |  |  |  |  |
| Photo acid generator 1 |  | 0.7 | 0.7 | 0.7 | 0.7 |
| Component (C) |  |  |  |  |  |
| Methyl orthoformate |  | 3 | 3 | 3 | 3 |
| Sensitizer |  | 0.01 | 0.01 | 0.03 | 0.03 |
| Diethylthioxanthone |  |  |  |  |  |
| Eval- uation | Photo-curable properties | Very good | Very good | Very good | Very good |
|  | Transparency | Good | Good | Good | Good |
|  | Weather-ability | Good | Good | Good | Good |
|  | Heat resistance | Very good | Very good | Very good | Very good |
|  | Pencil hardness | 4H | 7H | 3H | 4H |
|  | Storage stability | Good | Good | Good | Very good |

Example 11

In Example 11, a photo-curable composition was irradiated to evaluate its pattern development properties. That is, the photo-curable composition prepared in Example 1 was spin-coated onto a silicon wafer and pre-baked at 100° C. for 10 minutes whereby a film of 3 μm in thickness was formed. A pattern mask was placed on this film and irradiated with UV rays with 50 mJ/cm$^2$ with a high-pressure mercury lamp. Then, the non-irradiated portion was developed (washed) with MIBK, and thereafter the film was dried. When the pattern shape of the resulting film was observed under a microscope, it was confirmed that a pattern of 2 μm which is the minimum width of the pattern mask is formed with good reproducibility.

Separately, a methanol solution containing tetramethyl ammonium hydroxide (5% by weight) was used as an alkali developing solution in place of MIBK, and the film was developed in the same manner and dried. As a result, when the pattern shape of the resulting film was observed under a microscope, it was confirmed that a pattern of 2 μm which is the minimum width of the pattern mask is formed with good reproducibility.

Example 12
(Preparation of a photo-curable composition)

In Example 12, the effect of the hydrolyzable titanium compound added as component (G) was examined. That is, 101.2 g (0.51 mol) of phenyltrimethoxysilane (abbreviated hereinafter to PTMS) and 14.8 g (0.82 mol) of deionized water having an electrical conductivity of 8×10$^{-5}$ S·cm$^{-1}$ were placed in a vessel equipped with a stirrer, and PTMS was hydrolyzed under stirring by heating at 60° C. for 6 hours. Then, while MIBK was added dropwise to it, methanol formed as a byproduct by hydrolysis was removed by distillation. Then, the solid content was adjusted finally to 22% by weight whereby a solution containing polysiloxane as component (A) (referred to hereinafter as polysiloxane solution 7) was obtained. The weight average molecular weight of the resulting polysiloxane solution 7, as determined by GPC was 1500.

Then, 129.3 g (0.38 mol) of tetrabutoxy titanium was placed in a vessel with a stirrer in which the atmosphere was replaced by nitrogen, and a mixture consisting of 13.1 g (0.73 mol) of deionized water having an electrical conductivity of 8×10$^{-5}$ S·cm$^{-1}$ and 257.5 g of butanol was added thereto for 1 hour via a dropping funnel, with stirring under heating at 85° C., followed by stirring under heating at 85° C. for further 2 hours. Thereafter, the solvent and butanol formed as a byproduct by hydrolysis were removed by a rotary evaporator whereby 63.4 g of white crystals were obtained. Then, MIBK was added thereto and the solid content was adjusted finally to 22% by weight whereby a solution containing polytitanoxane as component (G) (referred to hereinafter as polytitanoxane solution 1) was obtained.

Then, 26 parts (including solvent) by weight of polysiloxane solution 7, 74 parts (including solvent) by weight of polytitanoxane solution 1, 0.7 part by weight of a photo acid generator CD1012 and 3.0 parts by weight of methyl orthoformate as a dehydrating agent were uniformed mixed to give a photo-curable composition.

(Evaluation of the photo-curable composition)

The resulting photo-curable composition was examined for the photo-curable properties, the storage stability and the like in the same manner as in Example 1, and the refractive index and UV ray shielding properties of its cured film were also examined in the following manner. The results thus obtained are shown in Table 3 and FIG. 1.

(1) Refractive Index

The photo-curable composition was spin-coated onto a silicon wafer and then irradiated with UV rays with 200 mJ/cm$^2$ under the conveyer type high-pressure mercury lamp, to form a cured film of 0.15 μm in thickness. The refractive index of the resulting cured film at 633 nm was determined by use of Ellipsometer.

FIG. 1 also shows the refractive index when the polytitanoxane content in the photo-curable composition is varied. The broken line shows the case where PTMS was used similarly to the Examples, and the solid line shows the case where MTMS was used. As can be seen from the curves in FIG. 1, it was confirmed that the refractive index can be easily lowered to a relatively small value of less than 1.60 by merely changing the mixing ratio of the polysiloxane composed of methyltrimethoxysilane and the polytinanoxane composed of tetrabutoxy titanium.

(2) UV Ray Shielding Properties

The photo-curable composition was spin-coated onto a quartz plate and then irradiated with UV rays with 200 mJ/cm$^2$ under the conveyer type high-pressure mercury lamp, to form a cured film of 0.3 μm in thickness. Then, its optical transmittance (T/%) at a wavelength of 320 nm was measured by a spectrophotometer, and from this optical transmittance, the UV shielding properties were examined according to the following criteria. The results are shown in Table 3.

Good: Optical transmittance is less than 20%.
Fair: Optical transmittance is 20 to 50% or less.
Bad: Optical transmittance is 50% or more.

Example 13

(Preparation of a photo-curable composition)

In Example 13, the effect of the hydrolyzable titanium compound added as component (G) on the hydrolyzable silane compound whose type was different from that in Example 12 was examined. That is, polysiloxane solution 8 was prepared in the same manner as in Example 12 except that methyltrimethoxysilane was used in place of phenyltrimethoxysilane in Example 12. Then, 30 parts by weight of polysiloxane solution 8, 70 parts by weight of polytinanoxane solution 1, 0.7 part by weight of a photo acid generator NDI-105, and 3.0 parts by weight of methyl orthoformate were uniformly mixed to prepare a photo-curable composition.

(Evaluation of the photo-curable composition)

The composition was examined for the photo-curable properties, the storage stability and the like, and the refractive index and the UV ray shielding properties of its cured film were also measured in the same manner as in Example 12. The results thus obtained are shown in Table 3 and in the solid line in FIG. 1. The examined photo-curable composition possesses the excellent photo-curable properties and the storage stability, and further the cured film made of the photo-curable composition was confirmed to have the excellent transparency, the heat resistance and the UV ray shielding properties.

TABLE 3

|  |  | Example 12 | Example 13 |
|---|---|---|---|
| Component (A) |  |  |  |
| Polysiloxane solution 7 |  | 26 |  |
| Polysiloxane solution 8 |  |  | 30 |
| Component (G) |  |  |  |
| Polytitanoxane solution 1 |  | 74 | 70 |
| Component (B) |  |  |  |
| Photo acid generator 1 |  | 0.7 |  |
| Photo acid generator 2 |  |  | 0.7 |
| Component (C) |  |  |  |
| Methyl orthoformate |  | 3 | 3 |
| Eval-uation | Photo-curable properties | Good | Good |
|  | Transparency | Good | Good |
|  | Heat resistance | Good | Good |
|  | Storage stability | Very good | Very good |
|  | Refractive index | 1.700 | 1.555 |
|  | UV ray shielding | Good | Good |

Example 14

In Example 14, the effect of the hydrolyzable silyl group-containing vinyl polymer (acryl silicon polymer) added as component (F) was examined. That is, polysiloxane solution 1 was prepared in the same manner as in Example 1. Further, 100 parts by weight of MEK was placed in a vessel with a stirrer kept at 50° C., and a reaction solution consisting of 31 parts by weight of acryloyl morpholine, 57 parts by weight of isobornyl acrylate, 9 parts by weight of tetrahydrofurfuryl acrylate, 3 parts by weight of γ-methacryloxypropyltrimethoxysilane and 1.0 part by weight of azobis (dimethylvaleronitrile) (V-65 from Wako Pure Chemical Industries) were added dropwise thereto for 1 hour. Thereafter, the mixture was heated and stirred at 80° C. for 3 hours whereby an acryl silicone polymer solution 1 with a solid content of 50% by weight was obtained. The weight average molecular weight of the resulting acryl silicon polymer, as determined by GPC was about 15,000.

Then, 318 parts by weight of the resulting polysiloxane solution 1, 60 parts by weight of acryl silicon polymer solution 1, 12 parts by weight of methyl orthoformate, and 3 parts by weight of a photo acid generator CD1012 were placed in a vessel with a stirrer and mixed uniformly to give a photo-curable composition.

(Evaluation of the photo-curable composition)

The resulting photo-curable composition was examined for the photo-curable properties, the storage stability and the like in the same manner as in Example 1, and its stain resistance, the chemical resistance, the adhesion strength and the flexibility were determined in the following manners. The results are shown in Table 4.

As can be seen from the results shown in Table 4, the photo-curable composition in Example 14 was confirmed to have the excellent photo-curable properties and the storage stability. Further, it was confirmed that the resulting cured film possesses the excellent adhesion strength to plastics and further possesses the excellent flexibility, the transparency, the weather-ability, the stain resistance and the chemical resistance.

(1) Stain Resistance

In accordance with JIS K 6902, 6 kinds of staining materials (coffee, soy source, an oil-based black magic marker (Pentel Co., Ltd.), blue ink (Platinum Pen Co.), a chlorine-based detergent (Sun Pole, Dainippon Jochukiku K.K.), 50% by weight curry paste (S&B Shokuhin Co., Ltd.) were brought into contact with the cured film for 24 hours and washed with water, and from the stains on the cured film, stain resistance was examined using the following criteria. When the oil-based black magic marker was used out of the staining materials, washing with ethanol was adopted in place of washing with water.

Good: There is no change in appearance after washing with water.

Bad: There is an abnormal appearance such as discoloration and dissolution after washing with water.

(2) Adhesion Strength

The resulting photo-curable composition was applied by a bar coater onto a polycarbonate plate, an acrylic plate (polymethyl methacrylate), PET (polyethylene terephthalate) film or a hard vinyl chloride plate respectively and then irradiated with UV rays with 300 mJ/cm$^2$ under the conveyer type high-pressure mercury lamp, to form a cured film of 5 $\mu$m in thickness. Then, the adhesion strength of the film to each of the substrates was examined on the basis of the following criteria in a checkers test in accordance with JIS K5400.

Good: In 100 checkers, no removal of the film was observed.

Fair: In 100 checkers, removal of the film from 1 to 10 checkers was observed.

Bad: In 100 checkers, removal of the film from 11 or more checkers was observed.

(3) Chemical Resistance

The resulting photo-curable composition was applied by using a bar coater onto a PET film and irradiated with UV rays with 300 mJ/cm$^2$, to form a cured film of 5 $\mu$m in thickness. Then, the film was rubbed 10 times with a cloth soaked in solvents (MEK, isopropanol, and xylene) and from the absence or presence of an abnormal appearance of the film after the solvents were dried, chemical resistance was examined according to the following criteria.

Good: No significant dissolution and discoloration of the cured film are observed in every solvent used.

Bad: Significant dissolution and discoloration of the cured film are observed in at least one solvent.

(4) Flexibility (Mandrel test)

The resulting photo-curable composition was applied by using a bar coater onto a PET film of 10 cm length×10 cm width×120 $\mu$m thickness and irradiated with UV rays with 300 mJ/cm$^2$, to form a cured film of 5 $\mu$m in thickness. Then, each film was wound up on a metal bar having diameter of 1, 5, 8 or 10 mm and left for 5 seconds. Thereafter, the surface of each cured film was observed under a microscope (50 magnifications), and from the presence or absence of cracking on the film, its flexibility was examined according to the following criteria.

Very good: There is no cracking when a metal bar of 1 mm in diameter was used.

Good: There is no cracking when a metal bar of 5 mm in diameter was used.

Fair: There is no cracking when a metal bar of 10 mm in diameter was used.

Bad: There is cracking when a metal bar of 10 mm in diameter was used.

Example 15

(Preparation of a photo-curable composition)

In Example 15, the co-condensation effect of vinyl polymer having a hydrolyzable silyl group as a component (F) and hydrolyzable silane compound as a component (A) was examined. That is, a solution consisting of 60 parts by weight of n-butyl methacrylate, 20 parts by weight of methyl methacrylate, 6 parts by weight of hydroxyethyl methacrylate, 6 parts by weight of γ-methacryloxypropyltrimethoxysilane, and 1.0 part by weight of azobis(dimethylvaleronitrile) (V-65 from Wako Pure Chemical Industries) was added dropwise for 1 hour to 100 parts by weight of MEK heated at 50° C. in a vessel. Thereafter, the mixture was heated to 80° C. and stirred for 3 hours whereby acryl silicon polymer solution 2 with a solid content of 50% by weight was obtained. The weight average molecular weight of acryl silicon polymer solution 2, as determined by GPC was about 15,000.

Then, 140 parts by weight (1.029 mol) of MTMS and 27.8 g (1.544 mol) of deionized water having an electrical conductivity of 8×10$^{-5}$ S·cm$^{-1}$ were added to 60 parts by weight of the acryl silicon polymer solution 2, and the mixture was stirred under heating at 60° C. for 5 hours, whereby a composition having the MTMS co-condensed with the acryl silicon polymer was obtained. While MIBK was added successively dropwise to this composition, methanol was distilled so that the solvent was replaced, whereby a co-condensed solution containing a composition having the MTMS co-condensed with the acryl silicon polymer (component A/component B=70/30 by weight) was obtained. The weight average molecular weight of this co-condensed solution, as determined by GPC was about 10,000.

Then, 100 parts by weight of the resulting co-condensed solution (solid content:22 wt. %) between the MTMS and the acryl silicon polymer, 0.66 part by weight of a photo acid generator (Sun Aide SI100, Sanshin Kagaku K.K.), and 3 parts by weight of methyl orthoformate were mixed to give a photo-curable composition.

(Evaluation of the photo-curable composition)

The resulting photo-curable composition was examined in the same manner in Example 14. The results are shown in Table 4. As can be seen from the results, the photo-curable composition in Example 15 was confirmed to have the excellent photo-curable properties and the storage stability respectively. Further, it was confirmed that the resulting cured film possesses the excellent adhesion strength to plastics and further possesses the excellent flexibility, the transparency, the weather-ability, the stain resistance and the chemical resistance.

TABLE 4

|  |  | Example 14 | Example 15 |
|---|---|---|---|
| Component (A) | | | |
| Polysiloxane solution 1 | | 318 | |
| Component (F) | | | |
| Acryl silicon polymer solution 1 | | 60 | |
| Component (A/F) | | | |
| Acryl silicon polymer solution 2 | | 60 | 100 |
| Component (B) | | | |
| Photo acid generator 1 | | 3.0 | |
| Photo acid generator 3 | | | 0.66 |
| Component (C) | | | |
| Methyl orthoformate | | 12 | 3 |
| Eval- | Photo-curable | Good | Good |
| uation | properties | | |
| | Transparency | Good | Good |
| | Weather-ability | Good | Good |
| | Storage stability | Good | Very good |

TABLE 4-continued

|  | Example 14 | Example 15 |
|---|---|---|
| Stain resistance | | |
| Coffee | Good | Good |
| Soy source | Good | Good |
| Black Magic ink | Good | Good |
| Blue ink | Good | Good |
| Hydrochloric acid- Detergent | Good | Good |
| 50% curry paste | Good | Good |
| Adhesion | | |
| PC | Good | Good |
| PMMA | Good | Good |
| PET | Good | Good |
| Hard vinyl chloride | Good | Good |
| Chemical resistance | Good | Good |
| Flexibility | Very good | Very good |

Example 16

In Example 16, the effects of colloidal silica as metal oxide particles added as component (H) and the oxetane compound having a hydrolyzable silyl group added as component (D) were examined. That is, the oxetane compound having a hydrolyzable silyl group was obtained in the following manner. First, 153 g (1.5 mol) of 3-hydroxymethyl-3-methyl oxetane, 30 g (0.09 mol) of tetrabutyl ammonium bromide, 726 g (6 mol) of allyl bromide and 0.5 L of 50% aqueous potassium hydroxide were placed in a 3-L separable flask equipped with a stirrer, to give a reaction solution (referred to hereinafter as reaction solution 1).

Then, while the temperature in the separable flask was maintained at 42° C., the reaction solution 1 was reacted for 4 hours under vigorous stirring. After the reaction was completed, the reaction solution 1 was removed from the separable flask and subjected to extraction with hexane as extracting solvent. The resulting extract was further refined by distillation to give 183 g (1.29 mol) of 3-allyloxymethyl-3-methyl oxetane.

171 g (1.2 mol) of the resulting 3-allyloxymethyl-3-methyl oxetane, 0.34 L of dehydrated toluene, and 0.15 ml of chlorinated platinic acid/isopropanol mixture (weight ratio=1/10) were placed in a 2-L separable flask, to give a reaction solution (referred to hereinafter as reaction solution 2).

Then, while the temperature in the separable flask was maintained at 70° C. and the reaction solution 2 was stirred, 197 g (1.2 mol) of triethoxysilane/0.16 L dehydrated toluene were added dropwise respectively. After the addition was finished, while the temperature in the separable flask was maintained at 70° C. and the reaction solution 2 was allowed to react for 4 hours under stirring. After the reaction was completed, the reaction solution 2 was removed from the separable flask and refined by distillation to give 307 g (1.0 mol) of [(3-methyloxetane-3-yl)-methyloxypropyl]-triethoxysilane (referred to hereinafter as silane compound A). 81 g of this silane compound A and 7 g of deionized water were placed respectively in a 0.5-L separable flask. Then, the silane compound A was hydrolyzed at 60° C. for 6 hours under stirring, and further 112 g of MIBK was added to it to give polysiloxane solution A having a solid content of 22% by weight.

Separately, 80 g of methyltrimethoxysilane (hereinafter, silane compound B) and 18 g deionized water were placed respectively in a 0.5-L separable flask. Then, the silane compound B was hydrolyzed at 60° C. for 6 hours under stirring, and 93 g of MIBK was added to give polysiloxane solution B having a solid content of 22% by weight.

Then, 52.3 g of the resulting polysiloxane solution A, 220.5 g of the polysiloxane solution B, 133.3 parts by weight 3of metal oxide particles MEK-ST (colloidal silica dispersed in MEK (average particle diameter, 0.01 to 0.015 μm; silica content, 30% by weight, available from Nissan Chemical Industries, Ltd.), 87.9 parts by weight of MIBK, and 6.0 g of a photo acid generator SP170 (Asahi Denka Kogyo K.K.) were placed in this order in a vessel and further stirred uniformly with a stirrer to give a photo-curable composition.

(Evaluation of the photo-curable composition)

The resulting photo-curable composition was examined in the same manner as in Example 1. As can be seen from the result shown in Table 5, the photo-curable composition in Example 16 was confirmed to have excellent photo-curable properties and storage stability respectively. Further, it was confirmed that the resulting cured film possesses the excellent adhesion strength to plastics, and further possesses the excellent flexibility, the transparency, the weather-ability, the stain resistance and the chemical resistance.

Examples 17 and 18

In Examples 17 and 18, the type of metal oxide particles as component (H) was changed to produce a photo-curable composition. That is, in Example 17, MEK-ST methanol-dispersed titanium oxide particles ST-01 (prepared by dispersing particles having an average particle diameter of 0.005 to 0.5 pm in polyoxyethylene nonyl phenyl ether as dispersing agent in a beads mill and manufactured by Ishihara Techno Co., Ltd.) were used in place of the metal oxide particles in Example 1, to produce a photo-curable composition.

In Example 18, isopropanol-dispersed zinc oxide (solid content of 30% by weight, from Sumitomo Osaka Cement Co., Ltd.) was used in place of the metal oxide particles in Example 1, to produce a photo-curable composition.

The resulting photo-curable compositions were examined respectively in the same manner as in Example 1. As can be seen from the results shown in Table 5, the photo-curable compositions in Examples 17 and 18 were confirmed to have the excellent photo-curable properties and the storage stability. Further, it was confirmed that the resulting cured films possess the excellent adhesion strength to plastics and further possess the excellent flexibility, the transparency, the weather-ability, the stain resistance and the chemical resistance.

TABLE 5

|  | Example 16 | Example 17 | Example 18 |
|---|---|---|---|
| Component (H) | | | |
| MEK-ST | 133.3 | | |
| TiO$_2$ sol | | 133.3 | |
| ZnO sol | | | 133.3 |
| Component (A) | | | |
| Polysiloxane solution A | 52.3 | 52.3 | 52.3 |
| Polysiloxane solution B | 220.5 | 220.5 | 220.5 |
| Component (C) | | | |
| Methyl orthoformate | 25.0 | 25.0 | 25.0 |

TABLE 5-continued

|  |  | Example 16 | Example 17 | Example 18 |
|---|---|---|---|---|
| Component (B) |  |  |  |  |
| Photo acid generator 4 (SP-170) |  | 6.0 | 6.0 | 6.0 |
| Organic solvent |  |  |  |  |
| MIBK |  | 62.9 | 62.9 | 62.9 |
| Eval- | Photo- | Good | Good | Good |
| uation | curable |  |  |  |
|  | properties |  |  |  |
|  | Transparency | Good | Good | Good |
|  | Pencil | 4H | 4H | 4H |
|  | hardness |  |  |  |
|  | Storage | Good | Very | Very |
|  | stability |  | good | good |
|  | Adhesion |  |  |  |
|  | Si wafer | Good | Good | Good |
|  | PET | Good | Good | Good |
|  | PMMA | Fair | Fair | Fair |
|  | Quartz | Good | Good | Good |

Example 19

In Example 19, a photo-curable composition containing curable metal oxide particles was examined. That is, 7.8 parts by weight of the silane compound A obtained in Example 16, 86.7 parts by weight of MEK-ST and 1.4 parts by weight of deionized water were placed in a 0.5-L separable flask, to prepare a mixture. This mixture was allowed to react at 80° C. for 6 hours under stirring, and further 2.8 parts by weight of methyl orthoformate was added thereto. Thereafter, the mixture was stirred under heating at 80° C. for 1 hour whereby a colorless and transparent dispersion with a solid content of 33.5% by weight having the curable metal oxide particles dispersed therein was obtained (curable metal oxide particles "a").

153.7 g of the curable metal oxide particles "a" thus obtained and 220.5 g of polysiloxane solution B were placed successively in a vessel and stirred uniformly with a stirrer. Then, 6.0 g of an optical initiator SP170 (Asahi Denka Kogyo K.K.), 94.8 g of MIBK and 25 g of methyl orthoformate as a dehydrating agent were added thereto to prepare a photo-curable composition.

The photo-curable properties, the adhesion strength, the transparency, the hardness and the storage stability of the resulting photo-curable composition were examined. As can be seen from the results shown in Table 6, the photo-curable composition in Example 19 was confirmed to possess the excellent photo-curable properties and the storage stability. Further, it was confirmed that the resulting cured film has the excellent adhesion strength to plastics and inorganic materials and further has the excellent transparency and the hardness.

Example 20

In Example 20, a photo-curable composition containing a different type of curable metal oxide particles was examined. That is, in Example 20, a mixture consisting of 7.8 parts by weight of silane compound A, 86.7 parts by weight of methanol-dispersed titanium oxide particles ST-01 (Ishihara Techno), and 1.4 parts by weight of deionized water was stirred under heating at 80° C. for 6 hours in the same manner as in Example 9. Then, 2.8 parts by weight of methyl orthoformate was added thereto, and the mixture was further stirred under heating at 80° C. for 1 hour whereby a colorless and transparent dispersion (curable metal oxide particles "c") having the curable metal oxide particles "c" dispersed therein was obtained.

The photo-curable properties, the adhesion strength, the transparency, the hardness and the storage stability of the curable metal oxide particles "c" thus obtained were examined. As can be seen from the results shown in Table 6, the photo-curable composition in Example 20 was confirmed to have the excellent photo-curable properties and the storage stability even if different curable metal oxide particles were used. Further, it was confirmed that the resulting cured film possesses the excellent adhesion strength to plastics and inorganic materials and further possesses the excellent transparency and the hardness.

TABLE 6

|  |  | Example 19 | Example 20 |
|---|---|---|---|
| Curable metal oxide particles |  |  |  |
| A |  | 153.7 |  |
| B |  |  | 153. 7 |
| Component (A) |  |  |  |
| Polysiloxane solution B |  | 220.5 | 220.5 |
| Component (C) |  |  |  |
| Methyl orthoformate |  | 25.0 | 25.0 |
| Component (B) |  |  |  |
| Photo acid generator 4 (SP170) |  | 6.0 | 6.0 |
| Organic solvent |  |  |  |
| MTBK |  | 94.8 | 94.8 |
| Eval- | Photo-curable | Very | Good |
| uation | properties | good |  |
|  | Transparency | Good | Good |
|  | Pencil hardness | 4H | 4H |
|  | Storage stability | Very good | Very good |
|  | Adhesion |  |  |
|  | Si wafer | Good | Good |
|  | PET | Good | Good |
|  | PMMA | Fair | Fair |
|  | Quartz | Good | Good |

Example 21

In Example 21, the effect of the fluorine-containing polymer as component (E) was examined. Specifically, first, the atmosphere in a 1.0-L autoclave made of stainless steel equipped with an electric stirrer was sufficiently replaced by a nitrogen gas. Then, 300 g of ethyl acetate (polymerization solvent), 21.9 g of ethyl vinyl ether, 34.9 g of 2-(3-methyl-oxetanemethoxy) ethyl vinyl ether, 10.0 g of nonionic reactive emulsifier NE-30 (Asahi Denka Kogyo K.K.), 1.0 g of azo group-containing polydimethylsiloxane VPS-1001 (Wako Pure Chemical Industries) as a radical generator, and 0.5 g of lauroyl peroxide were placed in the autoclave. Then, the copolymerization components were sufficiently stirred and then cooled to −50° C. with dry ice and methanol, and the oxygen in the system was removed by using a nitrogen gas again. Then, after 91.4 g hexafluoropropylene (gas) was introduced into the autoclave, the temperature in the autoclave was raised to 70° C. The pressure in the autoclave when the temperature reached 70° C. was 5.9 kgf/cm$^2$.

Then, while the copolymerization components in the autoclave were stirred in maintaining a temperature at 70° C., these were subjected to radical polymerization for 20 hours. When the pressure in the autoclave was reduced to 2.5 kgf/cm², the reaction was terminated by cooling the autoclave by water. After it was confirmed that the temperature in the autoclave dropped to room temperature, the autoclave was opened and the unreacted monomers were discharged into the outside of the system, and the fluorine-containing copolymer solution (polymer solution) was removed.

The resulting fluorine-containing copolymer solution was introduced into a large amount of methanol whereby the fluorine-containing copolymer was precipitated. Thereafter, the fluorine-containing polymer was washed with a large amount of methanol, then dried under vacuum at 50° C. to give 127 g (80% yield) purified fluorine-containing polymer having hydroxyl groups (referred to hereinafter as copolymer 1). The resulting copolymer 1 was measured 5 times respectively for the following evaluation items.

① Measurement of Weight Average Molecular Weight

The resulting fluorine-containing polymer was dissolved at a concentration of 0.5% by weight in tetrahydrofuran. Then, the retention time of the fluorine-containing copolymer through a GPC column was monitored with a refractive index (RI) meter in GPC unit HLC-8020 (Tosoh), and from this retention time, the average molecular weight of the fluorine-containing copolymer was determined using polystyrene as molecular-weight standards. As a result, the weight average molecular weight of the resulting fluorine-containing copolymer was 48,000.

② Measurement of Fluorine Content

The fluorine content of the resulting fluorine-containing copolymer was determined by alizarin complexometry. The result indicated that the fluorine content in the resulting fluorine-containing copolymer was 4.2% by weight.

③ Measurement of Glass Transition Temperature (Tg)

The Tg of the resulting fluorine-containing copolymer was determined at an increasing temperature of 10° C./min. under a nitrogen stream in DSC unit 910 (Du Pont). The result indicated that Tg of the resulting fluorine-containing copolymer was 31° C.

Separately, 80 g of MTMS and 16 g of deionized water having an electrical conductivity of $8 \times 10^{-5}$ S·cm$^{-1}$ were placed in a vessel equipped with a stirrer, and MTMS was hydrolyzed under stirring by heating at 60° C. for 6 hours. Then, while MIBK was added dropwise, methanol formed as a byproduct by hydrolysis was removed by distillation, and a MTMS condensate solution (condensate 1) with a solid content of 22% by weight was finally obtained.

70 g of the resulting condensate 1 solution (solid content, 22% by weight) in MIBK, 30 g copolymer 1 solution (solid content, 22% by weight) in MIBK, 0.66 g of Sun Aide SI-100 (Sanshin Kagaku Kogyo K.K.) as a photo acid generator, and 3.0 g methyl orthoformate as a dehydrating agent were placed in a vessel equipped with a stirrer and then mixed uniformly whereby a photo-curable composition was obtained. The resulting photo-curable composition was examined for the photo-curable properties and the storage stability in the same manner as in Example 1, and further examined for the film forming properties, the adhesion strength and the Magic ink-wiping properties, as shown below. The results are shown in Table 7.

(1) Film Forming Properties

The resulting photo-curable composition was applied by a bar coater onto a quartz plate under the atmosphere to form a film of 3 μm in thickness. Then, the film forming properties of the photo-curable composition were examined with eyes according to the following criteria. The results are shown in Table 7.

Good: A film of uniform thickness is obtained, and cissing is not observed.

Fair: The thickness of the coating is not uniform, but cissing is not observed.

Bad: Cissing is observed, and a uniform film cannot be obtained.

(2) Adhesion Strength

The resulting photo-curable composition was spin-coated onto a polycarbonate plate, an acrylic plate (polymethyl methacrylate) and PET film respectively and then irradiated with UV rays with 300 mJ/cm² under the conveyer type high-pressure mercury lamp, to form a cured film of 10 μm in thickness. Then, the adhesion of the film to each of the substrates was examined If according to the following criteria in the checkers test in accordance with JIS K5400. The results are shown In Table 7.

Very good: In 100 checkers, no removal of the film was observed.

Good: In 100 checkers, removal of the film from 1 to 10 checkers was observed.

Fair: In 100 checkers, removal of the film from 11 to 20 checkers was observed.

Bad: In 100 checkers, removal of the film from 21 or more checkers was observed.

(3) Scratch Resistance (Wiping test)

The photo-curable composition was spin-coated onto a quartz plate and irradiated with UV rays with 300 mJ/cm² under the conveyer type high-pressure mercury lamp, to form a cured film of 2 μm in thickness. The surface of the resulting cured film was wiped out with a Kim Wipe paper (Jujo Kimberly K.K.) under the conditions that the loading was 1 kg/cm² and the repetition number of the wiping was 50. The scratch resistance was examined with eyes according to the following criteria. The results are shown in Table 7.

Good: The delamination or a trace of the scratching was not observed.

Fair: 10 or less traces of scratching were observed.

Bad: 10 or more traces of scratching were observed.

(4) Magic Ink-Wiping Properties

The photo-curable composition was spin-coated onto a quartz plate and irradiated with UV rays with 300 mJ/cm² under the conveyer type high-pressure mercury lamp, to form a cured film of about 2 μm in thickness. A part (1 cm×1 cm square) of the surface of the resulting cured film was painted out with oil-based Magic ink (Pentel Co., Ltd.) and left for 24 hours. Thereafter, the Magic ink was wiped off with a Kim Wipe paper (Jujo Kimberly K.K.), and the Magic ink-wiping properties were examined with eyes according to the following criteria. The results are shown in Table 7.

Very good: The Magic ink can be completely wiped off, and no trace of the ink is observed.

Good: The Magic ink can be wiped off, but a trace of the ink is observed.

Fair: The Magic ink cannot completely be wiped off, and a trace of the ink is also observed.

Bad: The Magic ink evidently remains.

(5) Refractive Index

The photo-curable composition was applied by using a bar coater onto a Silicon wafer and then irradiated with UV rays with 300 mJ/cm² to form a cured film of 0.12 μm in thickness. The refractive index of the resulting cured film was determined at 25° C. by an Ellipsometer. As a result, the refractive index of 1.417 was obtained. The results are shown in Table 7.

(6) Anti-Reflective Property

The photo-curable composition was spin-coated onto a polycarbonate plate (thickness 4 mm) and irradiated with UV rays with 300 mJ/cm$^2$ under the conveyer type high-pressure mercury lamp, to form a cured film of 0.12 μm in thickness. The anti-reflective property of the resulting cured film was measured by a photospectrometer U-3410 (Hitachi Limited) with an integration ball having a diameter of 60 mm. From the obtained results, the anti-reflection effect was evaluated according to the following criteria. The results are shown in Table 7. Very good: Anti-reflection index is less than 2%.
Good: Anti-reflection index is 2% to 3% or less.
Fair: Anti-reflection index is 3% to 5% or less.
Bad: Anti-reflection index is 5% or more.

Example 22

In Example 22, the effects of the fluorine-containing polymer as component (E) and colloidal silica as component (H) were examined, and a photo-curable composition was prepared in the same manner as in Example 21 except that colloidal silica was further added. That is, 30 g of copolymer 1 solution (solid content, 22% by weight) in MIBK, 70 g of condensate 1 solution (solid content, 22% by weight) in MIBK, 0.66 g of Sun Aide SI-100 as a photo acid generator, 3.0 g of methyl orthoformate as a dehydrating agent, and 35 g of colloidal silica dispersed in methanol (Nissan Chemical Industries, Ltd.) were placed in a vessel equipped with a stirrer and mixed uniformly whereby a photo-curable composition was obtained. The resulting photo-curable composition was examined in the same manner as in Example 21.

Example 23

In Example 23, the effect of the reactive diluent besides the fluorine-containing polymer as component (E) was examined, and a photo-curable composition was prepared in the same manner as in Example 21 except that the epoxy compound was added as a cationic polymerizable monomer. That is, 30 g of copolymer 1 solution (solid content, 22% by weight) in MIBK, 70 g of condensate 1 solution (solid content, 22% by weight) in MIBK, 0.66 g of Sun Aide SI-100 as a photo acid generator, 3.0 g methyl orthoformate as a dehydrating agent, and 10 g epoxy compound KRM2110 (Asahi Denka Kogyo K.K.) were placed in a vessel equipped with a stirrer and mixed and stirred uniformly whereby a photo-curable composition was obtained. The resulting photo-curable composition was examined in the same manner as in Example 21.

Example 24

In Example 24, a photo-curable composition was obtained in the same manner in Example 21 except that condensate 2 was used in place of copolymer 1 and condensate 1 in Example 21. The resulting photo-curable composition was examined in the same manner as in Example 21.

Condensate 2 was prepared in the following manner. First, 100 g copolymer 1 i.e. the fluorine-containing copolymer having hydroxyl groups obtained in polymerization example 1 in Example 21, 20 g of γ-isocyanate propyltriethoxysilane (abbreviated hereinafter to NCO-silane), 500 g of methyl isobutyl ketone, and 0.01 g of dibutyltin dilaurate were placed in a reactor equipped with a stirrer. Then, copolymer 1 and NCO-silane were allowed to react under stirring in a nitrogen gas at 20° C. for 12 hours. Next, an aliquot of the resulting reaction solution was removed, and a predetermined amount of dibutyl amine was added to the aliquot to react with unreacted NCO-silane therein. Then, the unreacted dibutyl amine was titrated with 0.1 N hydrochloric acid to determine the amount of the unreacted NCO-silane.

As a result, it was confirmed that NCO-silane had been completely consumed in the reaction solution, and NCO-silane and copolymer 1 had been sufficiently reacted.

An aliquot of this reaction solution was applied onto a NaCl plate and dried in a nitrogen atmosphere, to form a film. When an IR spectrum of this film was taken, a peak attributable to the isocyanate group was not observed therein, whereas a new peak attributable to an urethane group formed by reaction of the isocyanate group was observed therein.

Accordingly, from the results of the titration and IR spectrum described above, it was confirmed that the reaction between NCO-silane and copolymer 1 was completed whereby the silane-modified fluorine-containing copolymer was obtained.

Further, a part of the reaction solution thus confirmed to contain the silane-modified fluorine-containing copolymer was removed and introduced into a large amount of methanol to precipitate the silane-modified fluorine-containing copolymer. Thereafter, the silane-modified fluorine-containing copolymer was washed with a large amount of methanol and dried under vacuum at 50° C. to give the purified silane-modified fluorine-containing polymer (referred to hereinafter as copolymer 1-a).

Then, copolymer 1-a, 30 g of (MTMS), and 28 g of deionized water having an electrical conductivity of 8×10$^{-5}$ S·cm$^{-1}$ were go placed in a vessel equipped with a stirrer, and then stirred under heating at 60° C. for 6 hours whereby copolymer 1-a was condensed with MTMS. Then, while MIBK was added dropwise to it, methanol formed as a byproduct by hydrolysis was removed by distillation, and finally a MTMS condensate solution (condensate 2) with a solid content of 22% by weight was obtained. The resulting photo-curable composition was examined in the same manner as in Example 21.

TABLE 7

| | Example 21 | Example 22 | Example 23 | Example 24 |
|---|---|---|---|---|
| Component (A) | | | | |
| Copolymer 1 | | | 30 | |
| Condensate 1 | 30 | 30 | 70 | |
| Condensate 2 | 70 | 70 | | 100 |
| Component (B) | | | | |
| Photo acid generator 1 (SI100) | 0.66 | 0.66 | 0.66 | 0.66 |
| Component (C) | | | | |
| Methyl orthoformate | 3.0 | 3.0 | 3.0 | 3.0 |
| Component (H) | | | | |
| Colloidal silica | | 35 | 35 | |
| Reactive diluent | | | | |
| KBM2110 | | | 10 | |
| Evaluation | | | | |
| Photo-curable properties | Very good | Very good | Very good | Good |
| Transparency | Good | Good | Good | Good |
| Weather-ability | Good | Good | Good | Good |
| Storage stability | Good | Good | Good | Good |
| Film-forming properties | Good | Good | Good | Good |
| Adhesion | | | | |
| PC | Very good | Very good | Very good | Very good |
| PMMA | Very good | Good | Very good | Very good |
| PET | Very good | Good | Very good | Very good |
| Resistance to scuffing property | Good | Good | Good | Good |
| Magic ink-wiping property | Very good | Very good | Very good | Very good |

TABLE 7-continued

| | Example 21 | Example 22 | Example 23 | Example 24 |
|---|---|---|---|---|
| Refractive index | 1.418 | 1.431 | 1.454 | 1.418 |
| Anti-reflective property | Very good | Good | Good | Good |

What is claimed is:

1. A photo-curable composition comprising the following components (A) to (C):

(A) both a hydrolyzable silane compound represented by the general formula (1) and a hydrolyzate thereof or either of the two, $$(R^1)_p Si(X)_{4-p} \quad (1)$$

wherein $R^1$ is a non-hydrolyzable organic group having 1 to 12 carbon atoms, X is a hydrolyzable group, and p is an integer of 0 to 3;

(B) a photo acid generator; and (C) a dehydrating agent.

2. The photo-curable composition according to claim 1 wherein a hydrolyzable silane compound other than component (A) which is represented by the following general formula (2) and a hydrolyzate thereof or either of the two are contained as component (D), $$(Y)(R^1)_q Si(X)_{3-q} \quad (2)$$

wherein $R^1$ and X have the same meanings as defined in the general formula (1), Y is an isocyanate group, a mercapto group, an epoxy group, an oxetane group or an acryloyl group, and q is an integer of 0 to 2.

3. The photo-curable composition according to claim 1 wherein a fluorine-containing polymer is contained as component (E).

4. The photo-curable composition according to claim 1 wherein a vinyl polymer having a hydrolyzable silyl group which is other than component (A) and which is represented by the following general formula (3) is further contained as component (F),

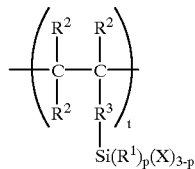

(3)

wherein $R^2$ groups are independently a hydrogen atom, a halogen atom or a monovalent organic group having 1 to 12 carbon atoms, $R^3$ is a single bond or a divalent organic group having 1 to 200 carbon atoms, t is an integer of 1 to 1,000, and $R^1$, X and p have the same meaning as defined in the general formula (1).

5. The photo-curable composition according to claim 1 wherein a hydrolyzable titanium compound represented by the following general formula (4) is contained as component (G), $$Ti(X)_4 \quad (4)$$

wherein X has the same meaning as defined in the general formula (1).

6. The photo-curable composition according to claim 1 wherein metal oxide particles are contained as component (H).

7. The photo-curable composition according to claim 1 wherein a reactive diluent is contained.

8. The photo-curable composition according to claim 1 wherein the dehydrating agent is at least one compound selected from the group consisting of carboxylates, acetals and carboxylic anhydrides.

9. The photo-curable composition according to claim 1 wherein the boiling point of the dehydrating agent is in the range of 40 to 200° C. under the condition of normal pressures.

10. The photo-curable composition according to claim 1 wherein the amount of the dehydrating agent added is in the range of 0.1 to 100 parts by weight relative to 100 parts by weight of component (A).

11. The photo-curable composition according to claim 1 wherein the amount of the photo acid generator added is in the range of 0.1 to 15 parts by weight relative to 100 parts by weight of component (A).

12. A method for photo-curing a photo-curable composition comprising the following components (A) to (C) by exposing to an energy ray:

(A) both a hydrolyzable silane compound represented by the general formula (1) and a hydrolyzate thereof or either of the two, $$(R^1)_p Si(X)_{4-p} \quad (1)$$

wherein $R^1$ is a non-hydrolyzable organic group having 1 to 12 carbon atoms, X is a hydrolyzable group, and p is an integer of 0 to 3;

(B) a photo acid generator; and (C) a dehydrating agent.

* * * * *